US009647232B2

(12) United States Patent
Kakizoe et al.

(10) Patent No.: US 9,647,232 B2
(45) Date of Patent: May 9, 2017

(54) ORGANIC ELECTROLUMINESCENT DEVICE, ILLUMINATION APPARATUS, AND ILLUMINATION SYSTEM

(71) Applicant: Kabushiki Kaisha Toshiba, Minato-ku (JP)

(72) Inventors: Hayato Kakizoe, Kawasaki (JP); Daimotsu Kato, Fuchu (JP); Tomoaki Sawabe, Sumida (JP); Keiji Sugi, Fujisawa (JP); Tomio Ono, Yokohama (JP); Shintaro Enomoto, Yokohama (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 25 days.

(21) Appl. No.: 14/813,986

(22) Filed: Jul. 30, 2015

(65) Prior Publication Data

US 2015/0340650 A1    Nov. 26, 2015

Related U.S. Application Data

(63) Continuation of application No. PCT/JP2013/078365, filed on Oct. 18, 2013.

(30) Foreign Application Priority Data

Feb. 4, 2013  (JP) .................................. 2013-019963

(51) Int. Cl.
*H01L 51/52* (2006.01)
*H01L 27/32* (2006.01)
*H05B 33/08* (2006.01)

(52) U.S. Cl.
CPC ...... *H01L 51/5246* (2013.01); *H01L 27/3276* (2013.01); *H01L 51/5203* (2013.01);
(Continued)

(58) Field of Classification Search
CPC ......... H01L 2251/5361; H01L 51/5218; H01L 51/5221; H01L 51/5271; H01L 51/5203;
(Continued)

(56) References Cited

U.S. PATENT DOCUMENTS 8,129,903 B2 *  3/2012  Mizuno ............... H01L 51/5259
                                                        313/512
8,283,858 B2 * 10/2012  Yonehara .................. H01J 1/62
                                                        313/501
(Continued)

FOREIGN PATENT DOCUMENTS

CN    102208432 A    10/2011
JP    2006-147190 A   6/2006
(Continued)

OTHER PUBLICATIONS

International Search Report mailed Feb. 4, 2014 for PCT/JP2013/078365 filed Oct. 18, 2013 with English translation.
(Continued)

*Primary Examiner* — Vibol Tan
(74) *Attorney, Agent, or Firm* — Oblon, McClelland, Maier & Neustadt, L.L.P.

(57) ABSTRACT

An organic electroluminescent device includes a first electrode, an insulating layer, an organic light emitting layer, and a second electrode. The insulating layer is provided on the first electrode. The insulating layer includes a first opening for exposing a part of the first electrode. The organic light emitting layer includes a first part and a second part. The first part is provided on the part of the first electrode. The second part is provided on the insulating layer. The second electrode is provided on the organic light emitting layer. The second electrode includes a conductive part and a plurality of second openings. The conductive part is disposed on at least a part of the first part. Each of the second openings exposes
(Continued)

a part of the organic light emitting layer. The second electrode is light-reflective.

20 Claims, 15 Drawing Sheets

(52) U.S. Cl.
CPC ..... *H01L 51/5225* (2013.01); *H05B 33/0896* (2013.01); *H01L 27/3204* (2013.01); *H01L 51/5212* (2013.01); *H01L 2251/5361* (2013.01)

(58) Field of Classification Search
CPC ............. H01L 27/3276; H01L 51/5012; H01L 27/3258; H01L 27/3204; H01L 27/3202; H01L 27/3225; H01L 51/5246; H01L 51/5225; H05B 33/0896; H05B 33/06; H05B 33/10; H05B 33/22

See application file for complete search history.

(56) References Cited

U.S. PATENT DOCUMENTS

| | | | |
|---|---|---|---|
| 8,368,129 B2 * | 2/2013 | Ono | H01L 21/56 257/291 |
| 8,599,115 B2 * | 12/2013 | Kimura | G09G 3/3233 345/212 |
| 8,841,656 B2 | 9/2014 | Sugizaki et al. | |
| 8,853,936 B2 | 10/2014 | Sugizaki et al. | |
| 8,878,226 B2 * | 11/2014 | Yan | H01L 27/3244 257/88 |
| 8,902,383 B2 | 12/2014 | Sugi et al. | |
| 8,963,414 B2 | 2/2015 | Sawabe et al. | |
| 9,111,892 B2 * | 8/2015 | Nendai | H01L 51/5228 |
| 9,153,792 B2 * | 10/2015 | Ono | H01L 51/5212 |
| 9,214,476 B1 * | 12/2015 | Lin | H01L 27/3276 |
| 9,269,754 B2 * | 2/2016 | Lee | H01L 27/3246 |
| 9,425,241 B2 * | 8/2016 | Yamakita | G02B 5/201 |
| 2010/0314616 A1 | 12/2010 | Kodama et al. | |
| 2012/0001184 A1 | 1/2012 | Ha et al. | |
| 2014/0140047 A1 | 5/2014 | Sawabe et al. | |

FOREIGN PATENT DOCUMENTS

| | | |
|---|---|---|
| JP | 2006-294490 A | 10/2006 |
| JP | 2008-112112 A | 5/2008 |
| JP | 2011-023336 A | 2/2011 |
| JP | 2011-228249 A | 11/2011 |
| JP | 2011-249541 A | 12/2011 |
| JP | 2012-015092 A | 1/2012 |
| JP | 2012-018867 A | 1/2012 |
| JP | 2012-028144 A | 2/2012 |
| JP | 2013-200964 A | 10/2013 |

OTHER PUBLICATIONS

International Written Opinion mailed Feb. 4, 2014 for PCT/JP2013/078365 filed Oct. 18, 2013.
Combined Office Action and Search Report issued Oct. 13, 2015 in Taiwanese Patent Application No. 102139297 (with English language translation).
International Preliminary Report on Patentability and Written Opinion issued Aug. 13, 2015 in PCT/JP2013/078365 (with English translation).

* cited by examiner

ORGANIC ELECTROLUMINESCENT DEVICE, ILLUMINATION APPARATUS, AND ILLUMINATION SYSTEM

CROSS-REFERENCE TO RELATED APPLICATIONS

This is a continuation application of International Application PCT/JP2013/078365, filed on Oct. 18, 2013; the entire contents of which are incorporated herein by reference.

FIELD

Embodiments described herein relate generally to an organic electroluminescent device, an illumination apparatus, and an illumination system.

BACKGROUND

There is an organic electroluminescent device that includes a light transmissive first electrode, a second electrode, and an organic light emitting layer provided between the first electrode and the second electrode. There is an illumination apparatus using the organic electroluminescent device as a light source. There is an illumination system that includes a plurality of organic electroluminescent devices and a controller configured to control to turn on and turn off the plurality of organic electroluminescent devices. The organic electroluminescent device is caused to have light permeability by using a thin-line shaped second electrode, in which a plurality of openings are provided, and a light transmissive second electrode. An improvement in reliability is desired in such an organic electroluminescent device.

DETAILED DESCRIPTION

Figure 1:
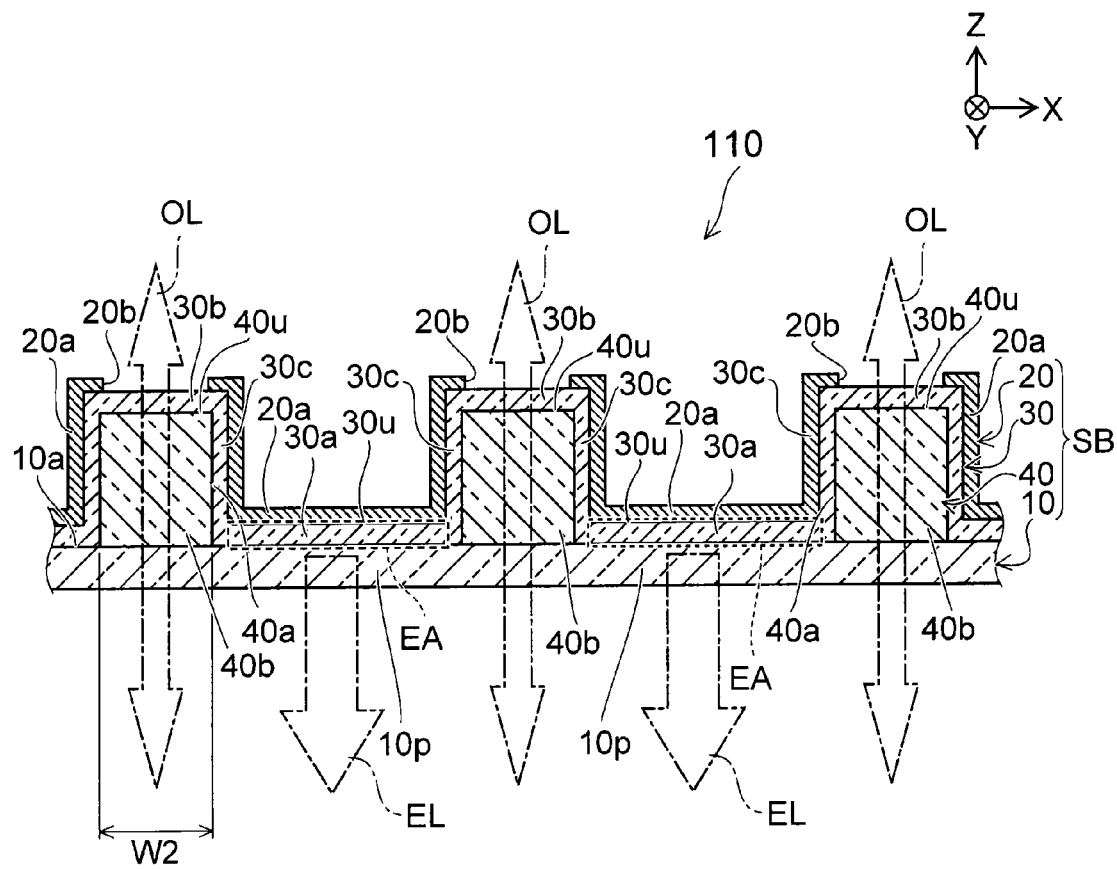
FIG. 1 is a schematic cross-sectional view showing an organic electroluminescent device according to a first embodiment.

According to one embodiment, an organic electroluminescent device includes a first electrode, an insulating layer, an organic light emitting layer, and a second electrode. The first electrode is light transmissive. The insulating layer is provided on the first electrode. The insulating layer includes a first opening for exposing a part of the first electrode. The insulating layer is light transmissive. The organic light emitting layer includes a first part and a second part. The first part is provided on the part of the first electrode. The second part is provided on the insulating layer. The organic light emitting layer is light transmissive. The second electrode is provided on the organic light emitting layer. The second electrode includes a conductive part and a plurality of second openings. The conductive part is disposed on at least a part of the first part. Each of the second openings exposes a part of the organic light emitting layer. The second electrode is light-reflective.

According to another embodiment, an organic electroluminescent device includes a first electrode, an insulating layer, an organic light emitting layer, a second electrode, and a first wiring layer. The first electrode is light transmissive. The insulating layer is provided on the first electrode. The insulating layer includes an opening for exposing a part of the first electrode. The insulating layer is light transmissive. The organic light emitting layer includes a first part and a second part. The first part is provided on the part of the first electrode. The second part is provided on the insulating layer. The organic light emitting layer is light transmissive. The second electrode is provided on the organic light emitting layer. The second electrode is light transmissive. The first wiring layer is provided between the first electrode and the insulating layer. The first wiring layer includes an opening for exposing a part of the first electrode. The first wiring layer is light-reflective.

According to another embodiment, an illumination apparatus includes an organic electroluminescent device and a power source. The organic electroluminescent device includes a first electrode, an insulating layer, an organic light emitting layer, and a second electrode. The first electrode is light transmissive. The insulating layer is provided on the first electrode. The insulating layer includes a first opening for exposing a part of the first electrode. The insulating layer is light transmissive. The organic light emitting layer includes a first part and a second part. The first part is provided on the part of the first electrode. The second part is provided on the insulating layer. The organic light emitting layer is light transmissive. The second electrode is provided on the organic light emitting layer. The second electrode includes a conductive part and a plurality of second openings. The conductive part is disposed on at least a part of the first part. Each of the second openings exposes a part of the organic light emitting layer. The second electrode is light-reflective. The power source is electrically connected to the first electrode and the second electrode and supplies an electric current to the organic light emitting layer through the first electrode and the second electrode.

According to another embodiment, an illumination apparatus includes an organic electroluminescent device and a power source. The organic electroluminescent device includes a first electrode, an insulating layer, an organic light emitting layer, a second electrode, and a first wiring layer. The first electrode is light transmissive. The insulating layer is provided on the first electrode. The insulating layer includes an opening for exposing a part of the first electrode. The insulating layer is light transmissive. The organic light emitting layer includes a first part and a second part. The first part is provided on the part of the first electrode. The second part is provided on the insulating layer. The organic light emitting layer is light transmissive. The second electrode is provided on the organic light emitting layer. The second electrode is light transmissive. The first wiring layer is provided between the first electrode and the insulating layer. The first wiring layer includes an opening for exposing a part of the first electrode. The first wiring layer is light-reflective. The power source is electrically connected to the first electrode and the second electrode and supplies an electric current to the organic light emitting layer through the first electrode and the second electrode.

According to another embodiment, an illumination system includes a plurality of organic electroluminescent devices and a controller. Each of the organic electroluminescent devices includes a first electrode, an insulating layer, an organic light emitting layer, and a second electrode. The first electrode is light transmissive. The insulating layer is provided on the first electrode. The insulating layer includes a first opening for exposing a part of the first electrode. The insulating layer is light transmissive. The organic light emitting layer includes a first part and a second part. The first part is provided on the part of the first electrode. The second part is provided on the insulating layer. The organic light emitting layer is light transmissive. The second electrode is provided on the organic light emitting layer. The second electrode includes a conductive part and a plurality of second openings. The conductive part is disposed on at least a part of the first part. Each of the second openings exposes a part of the organic light emitting layer. The second electrode is light-reflective. The controller is electrically connected to each of the organic electroluminescent devices and controls to turn on and turn off each of the organic electroluminescent devices.

According to another embodiment, an illumination system includes a plurality of organic electroluminescent devices and a controller. Each of the organic electroluminescent devices includes a first electrode, an insulating layer, an organic light emitting layer, a second electrode, and a first wiring layer. The first electrode is light transmissive. The insulating layer is provided on the first electrode. The insulating layer includes an opening for exposing a part of the first electrode. The insulating layer is light transmissive. The organic light emitting layer includes a first part and a second part. The first part is provided on the part of the first electrode. The second part is provided on the insulating layer. The organic light emitting layer is light transmissive. The second electrode is provided on the organic light emitting layer. The second electrode is light transmissive. The first wiring layer is provided between the first electrode and the insulating layer. The first wiring layer includes an opening for exposing a part of the first electrode. The first wiring layer is light-reflective. The controller is electrically connected to each of the organic electroluminescent devices and controls to turn on and turn off each of the organic electroluminescent devices.

Various embodiments will be described hereinafter with reference to the accompanying drawings.

The drawings are schematic or conceptual; and the relationships between the thicknesses and widths of portions, the proportions of sizes among portions, etc., are not necessarily the same as the actual values thereof. Further, the dimensions and the proportions may be illustrated differently among the drawings, even for identical portions.

In the specification and the drawings of the application, components similar to those described in regard to a drawing thereinabove are marked with like reference numerals, and a detailed description is omitted as appropriate.

First Embodiment

FIG. 1 is a schematic cross-sectional view showing an organic electroluminescent device according to a first embodiment.

Figure 2:
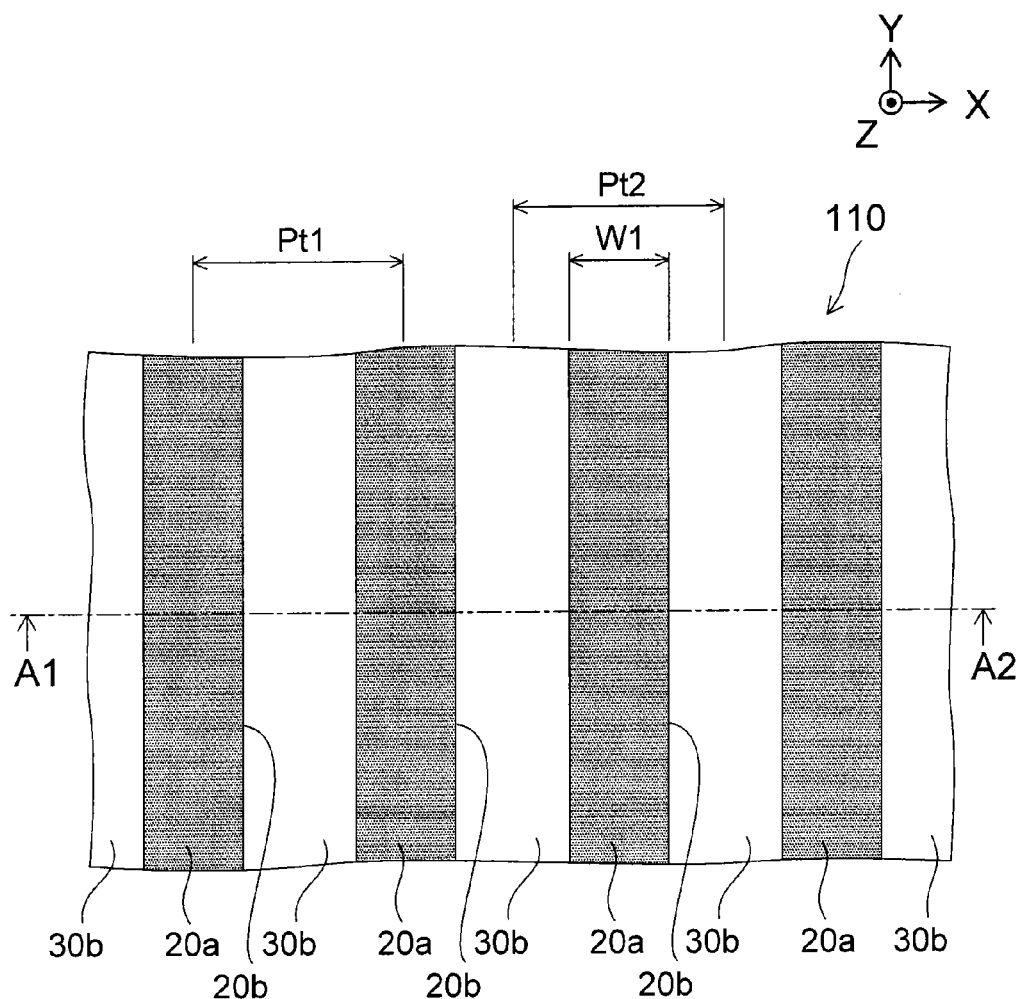
FIG. 2 is a schematic plan view showing the organic electroluminescent devices according to the first embodiment.

FIG. 2 is a schematic plan view showing the organic electroluminescent devices according to the first embodiment.

FIG. 1 is the cross-sectional view along an A1-A2 line of FIG. 2. These views enlarge and illustrate a part of the organic electroluminescent device according to the embodiment.

As shown in FIG. 1 and FIG. 2, an organic electroluminescent device 110 includes a stacked body SB. The stacked body SB includes a first electrode 10, a second electrode 20, an organic light emitting layer 30, and an insulating layer 40.

The first electrode 10 has an upper face 10a. The first electrode 10 has light permeability. The first electrode 10 is a transparent electrode, for example.

Here, the direction perpendicular to the upper face 10a is defined as a Z-axis direction. One direction parallel to the upper face 10a is defined as an X-axis direction. The direction perpendicular to the X-axis direction and Z-axis direction is defined as a Y-axis direction. The X-axis direction and Y-axis direction are the directions perpendicular to the Z-axis direction. The Z-axis direction corresponds to the thickness direction of the first electrode 10.

The insulating layer 40 is provided on the upper face 10a of the first electrode 10. The insulating layer 40 includes an opening 40a (a first opening) and an insulating part 40b. The insulating layer 40 includes a plurality of openings 40a and a plurality of insulating parts 40b, for example. Each of the plurality of openings 40a extends in a first direction and is arranged in a second direction intersecting with the first direction. In this example, each of the plurality of openings 40a extends in the Y-axis direction and is arranged in the X-axis direction. That is, in this example, each of the plurality of openings 40a is groove-shaped. Each of the plurality of openings 40a exposes a part of the first electrode 10. In this example, a plurality of portions of the first electrode 10 are exposed by each of the plurality of openings 40a. Hereinafter, the portion exposed by the opening 40a in the first electrode 10 is referred to as an exposed part 10p. Each of the plurality of insulating parts 40b is disposed between each of the plurality of openings 40a. In this example, each of the plurality of insulating parts 40b extends in the Y-axis direction. The insulating layer 40 is light-transmissive. The insulating layer 40 is transparent, for example.

The organic light emitting layer 30 is provided on the insulating layer 40. The organic light emitting layer 30 includes a first part 30a provided on the exposed part 10p of the first electrode 10 and a second part 30b provided on the insulating layer 40. The second part 30b is provided in at least a part on the insulating layer 40. The organic light emitting layer 30 has light permeability. The organic light emitting layer 30 has light permeability in a turn-off state, for example.

The organic light emitting layer 30 further includes a third part 30c between the first part 30a and the second part 30b, for example. The third part 30c is along the side surface of the insulating part 40b and connects the first part 30a and the second part 30b. In this example, the organic light emitting layer 30 includes a plurality of first parts 30a each being provided on each of the plurality of exposed parts 10p, a plurality of second parts 30b each being provided on each of the plurality of insulating parts 40b, and a plurality of third parts 30c each being between each of the plurality of first parts 30a and each of the plurality of second parts 30b. The organic light emitting layer 30 is continuously provided on each of the plurality of insulating parts 40b and on each of the plurality of exposed parts 10p, for example. The organic light emitting layer 30 is provided on at least a part of each of the plurality of insulating parts 40b and on each of the plurality of exposed parts 10p, for example.

The thickness (the length along the Z-axis direction) of the organic light emitting layer 30 is thinner than the thickness of the insulating layer 40 (insulating part 40b). The distance in the Z-axis direction between an upper face 30u of the first part 30a of the organic light emitting layer 30 and the upper face 10a of the first electrode 10 is shorter than the distance in the Z-axis direction between an upper face 40u of the insulating part 40b of the insulating layer 40 and the upper face 10a of the first electrode 10. That is, the upper face 30u of the first part 30a is positioned below the upper face 40u of the insulating part 40b.

The second electrode 20 is provided on the organic light emitting layer 30. The second electrode 20 includes a conductive part 20a and a plurality of openings 20b (second openings). The conductive part 20a is disposed on at least a part of the first part 30a. In this example, the second electrode 20 includes a plurality of conductive parts 20a. Each of the plurality of conductive parts 20a extends in the Y-axis direction and is arranged in the X-axis direction. Each of the plurality of conductive parts 20a is disposed at a position where it overlaps with each of the plurality of openings 40a when it is projected onto a plane (X-Y plane) parallel to the upper face 10a. Each of the plurality of conductive parts 20a is disposed at a position where it overlaps with each of the plurality of first parts 30a when it is projected onto the X-Y plane. Each of the plurality of conductive parts 20a is disposed on each of the plurality of first parts 30a.

Each of the plurality of openings 20b is disposed between each of the plurality of conductive parts 20a. In this example, each of the plurality of openings 20b has a groove shape extending in the Y-axis direction. Each of the plurality of openings 20b extends in the Y-axis direction and is arranged in the X-axis direction. Each of the plurality of openings 20b is disposed on each of the plurality of second parts 30b, for example. Each of the plurality of openings 20b exposes each of the plurality of second part 30b, for example. In this example, the second electrode 20 and insulating layer 40 have a stripe-shape.

The second electrode 20 (conductive part 20a) has light reflectivity, for example. The light reflectance of the second electrode 20 is higher than the light reflectance of the first electrode 10. In the specification, a state having a light reflectance higher than the light reflectance of the first electrode 10 is referred to "light-reflective".

The organic light emitting layer 30 is electrically connected to the first electrode 10 through each of the plurality of openings 40a. Each of the plurality of first parts 30a of the organic light emitting layer 30 is in contact with each of the plurality of exposed parts 10p of the first electrode 10, for example. As a result, the organic light emitting layer 30 is electrically connected to the first electrode 10.

The organic light emitting layer 30 is electrically connected to the second electrode 20. The organic light emitting layer 30 is in contact with each of the plurality of conductive parts 20a, for example. As a result, the organic light emitting layer 30 is electrically connected to the second electrode 20. In the specification, "being electrically connected to" includes "another electrical conductive member being interposed in between" other than "being directly in contact with".

Electric current is fed into the organic light emitting layer 30 using the first electrode 10 and the second electrode 20. As a result, the organic light emitting layer 30 emits light. When electric current flows into the organic light emitting layer 30, an electron and a hole are recombined to produce an exciter, for example. The organic light emitting layer 30 emits light utilizing the radiation of light during radiative deactivation of the exciter, for example.

In the organic electroluminescent device 110, a portion between the exposed part 10p and conductive part 20a in the organic light emitting layer 30 serves as an emission area EA. In this example, the organic light emitting layer 30 includes a plurality of emission areas EA each being between each of the plurality of exposed parts 10p and each of the plurality of conductive parts 20a. Electroluminescence EL generated from the emission area EA is emitted to the outside of the organic electroluminescent device 110 through the first electrode 10. A part of the electroluminescence EL is reflected by the second electrode 20, and is then emitted outside through the organic light emitting layer 30 and first electrode 10. That is, the organic electroluminescent device 110 is of a single-sided light emitting type.

Moreover, in the organic electroluminescent device 110, outside light OL incident from the outside transmits through the insulating part 40b and first electrode 10 between each of the plurality of conductive parts 20a. As described above, the organic electroluminescent device 110 causes the outside light OL, which is incident upon the organic electroluminescent device 110 from the outside, to transmit therethrough while emitting the electroluminescence EL. As described above, the organic electroluminescent device 110 has light permeability. As a result, in the organic electroluminescent device 110, an image in the background is visible through the organic electroluminescent device 110. That is, the organic electroluminescent device 110 is a see-through type filmy or tabular light source.

As described above, the organic electroluminescent device 110 of the embodiment can provide a light transmissive organic electroluminescent device. When the organic electroluminescent device 110 is applied to an illumination apparatus, the function to cause an image in the background to transmit therethrough, other than an illuminating function, allows for various new applications.

In the light transmissive organic electroluminescent device, the organic light emitting layer 30 may be provided on the first electrode 10 without providing the insulating layer 40. In such a configuration, for example a portion serving as the emission area EA of the organic light emitting layer 30 may be damaged in forming the second electrode 20.

For forming the second electrode 20, vacuum deposition is used, for example. Then, a mask (e.g., metal mask) for patterning the second electrode 20 may contact and damage the organic light emitting layer 30. Once the emission area EA is damaged, the first electrode 10 and the second electrode 20 will directly contact with each other and be shorted, for example. For example, the use of a stripe-shaped second electrode 20 would result in a linear defect. Therefore, for example, the yield of the organic light-emitting device will decrease.

Moreover, in the light transmissive organic electroluminescent device, by making the width of the conductive part 20a narrower, the visibility of the conductive part 20a itself can be suppressed and an image in the background can be excellently observed. In this case, in forming the second electrode 20, a higher accuracy is requested. However, if the formation accuracy of the second electrode 20 is increased, the risk of contacting between the mask and the organic light emitting layer 30 will increase. For example, if the distance between the mask and an object is long, a material to be vacuum-deposited will diffuse after transmitting through the mask, resulting in a decrease in the formation accuracy. In order to increase the formation accuracy in vacuum deposition or the like, it is necessary to bring the mask closer to an object. Therefore, if the formation accuracy of the second electrode 20 is increased, the risk of contacting between the mask and the organic light emitting layer 30 will increase.

In contrast, in the organic electroluminescent device 110 according to the embodiment, the insulating layer 40 is included and the organic light emitting layer 30 is provided in at least a part on the insulating layer 40. Then, the upper face 30u of the first part 30a is positioned below the upper face 40u of the insulating part 40b. As a result, in the organic electroluminescent device 110 according to the embodiment, even when the mask contacts the organic light emitting layer 30 in forming the second electrode 20, the mask will contact the second part 30b and insulating part 40b that will not serve as the emission area EA. That is, the insulating layer 40 functions as a contact prevention layer of the mask in forming the second electrode 20.

As a result, in the organic electroluminescent device 110, for example the contacting of the mask or the like with the first part 30a that will serve as the emission area EA of the organic light emitting layer 30 can be suppressed. In the organic electroluminescent device 110, for example in forming the second electrode 20, the scratching of the first part 30a that will serve as the emission area EA of the organic light emitting layer 30 can be suppressed. With the organic electroluminescent device 110, the yield can be improved, for example. With the organic electroluminescent device 110, high reliability can be obtained, for example. For example, the conductive part 20a having a narrow width can be formed accurately.

Figure 3:
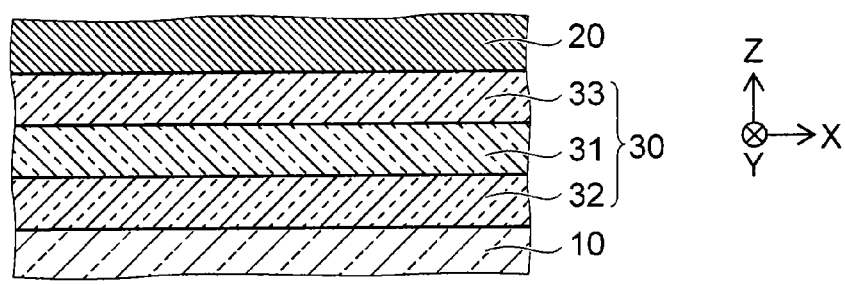
FIG. 3 is a schematic cross-sectional view showing a part of the organic electroluminescent device according to the first embodiment.

FIG. 3 is a schematic cross-sectional view showing a part of the organic electroluminescent device according to the first embodiment.

As shown in FIG. 3, the organic light emitting layer 30 includes a first layer 31. The organic light emitting layer 30 can further include at least any one of a second layer 32 and a third layer 33, as required. The first layer 31 emits light having a wavelength of visible light. The second layer 32 is provided between the first layer 31 and the first electrode 10. The third layer 33 is provided between the first layer 31 and the second electrode 20.

For the first layer 31, the materials, such as $Alq_3$ (tris(8-hydroxyquinolinolato)aluminum), F8BT (poly(9,9-dioctyl-fluorene-co-benzothiadiazole) and PPV (polyparaphenylene-vinylene), can be used, for example. For the first layer 31, a mixed material of a host material and a dopant added into the host material can be used. As the host material, for example CBP (4,4'-N,N'-bisdicarbazolyl-biphenyl), BCP (2,9-dimethyl-4,7-diphenyl-1,10-phenanthroline), TPD (4,4'-bis-N-3-methylphenyl-N-phenylaminobiphenyl), PVK (polyvinylcarbazole), PPT (poly(3-phenylthiophene)), or the like can be used. As the dopant material, for example Flrpic (iridium(III)bis(4,6-di-fluorophenyl)-pyridinate-N, C2'-picolinate), $Ir(ppy)_3$ (tris(2-phenylpyridine)iridium), Flr6 (bis(2,4-difluorophenylpyridinate)-tetrakis(1-pyrazolyl)borate-iridium(III)), or the like can be used. The material of the first layer 31 is not limited to these materials.

The second layer 32 functions as a hole injection layer, for example. The hole injection layer contains at least any one of PEDPOT: PPS (poly(3,4-ethylenedioxythiophene)-poly(styrenesulfonic acid)), CuPc (copper phthalocyanine), $MoO_3$ (molybdenum trioxide), and the like, for example. The second layer 32 functions as a hole transport layer, for example. The hole transport layer contains at least any one of α-NPD (4,4'-bis[N-(1-naphthyl)-N-phenylamino]biphenyl), TAPC (1,1-bis[4-[N,N-di(p-tolyl)amino]phenyl]cyclohexane), m-MTDATA (4,4',4"-tris[phenyl(m-tolyl)amino]triphenylamine), TPD (bis(3-methylphenyl)-N,N'-diphenylbenzidine), TCTA (4,4',4"-tri(N-carbazolyl)triphenylamine), and the like, for example. The second layer 32 may include, for example, a stacked structure of a layer functioning as the hole injection layer and a layer functioning as the hole transport layer. The second layer 32 may include a layer different from the layer functioning as the hole injection layer and from the layer functioning as the hole transport layer. The material of the second layer 32 is not limited to these materials.

The third layer 33 can include, for example, a layer functioning as an electron injection layer. The electron injection layer contains, for example, at least any one of lithium fluoride, cesium fluoride, lithium quinoline complex, and the like. The third layer 33 can include, for example, a layer functioning as an electron transport layer. The electron transport layer contains at least any one of Alq3 (tris(8 quinolinolato)aluminum(III)), BAlq (bis(2-methyl-8-cunilate)(p-phenylphenolate)aluminum), Bphen (bathophenanthroline), 3TPYMB (tris[3-(3-pyridyl)-mesityl]borane), and the like, for example. The third layer 33 may include, for example, a stacked structure of a layer functioning as the electron injection layer and a layer functioning as the electron transport layer. The third layer 33 may include a layer different from a layer functioning as the electron injection layer and from a layer functioning as the electron transport layer. The material of the third layer 33 is not limited to these materials.

For example, the light radiated from the organic light emitting layer 30 is substantially white light. That is, the light emitted from the organic electroluminescent device 110 is white light. Here, the "white light" is substantially white, and includes, for example, reddish, yellowish, greenish, bluish, and/or purplish white light, as well.

The first electrode 10 includes an oxide that contains at least any one element selected from the group consisted of In, Sn, Zn, and Ti, for example. For the first electrode 10, for example a film (e.g., NESA or the like) fabricated using a conductive glass containing, indium oxide, zinc oxide, tin oxide, indium tin oxide (ITO: Indium Tin Oxide), fluorine-doped tin oxide (FTO), or indium zinc oxide, and gold, platinum, silver, copper, or the like can be used. The first electrode 10 functions as an anode, for example. The material of the first electrode 10 is not limited to these materials.

The second electrode 20 contains at least any one of aluminum and silver, for example. For example, an aluminum film is used for the second electrode 20. Furthermore, an alloy of silver and magnesium may be used for the second electrode 20. Calcium may be added into this alloy. The second electrode 20 functions as a cathode, for example. The material of the second electrode 20 is not limited to these materials.

The first electrode 10 may be set to the cathode and the second electrode 20 may be set to the anode, so that the second layer 32 may be caused to function as the electron injection layer or electron transport layer and the third layer 33 may be caused to function as the hole injection layer or hole transport layer.

For the insulating layer 40, an insulative material can be used, and for example, a resin material, such as a polyimide resin or an acrylic resin, or an insulative inorganic material, such as a silicone oxide film (e.g., $SiO_2$), a silicon nitride film (e.g., SiN), or a silicon oxynitriding film, is used. The material of the insulating layer 40 is not limited to these materials.

The thickness (the length in the Z-axis direction) of the first electrode 10 is not less than 10 nm and not more than 500 nm, for example, and more preferably, not less than 50 nm and not more than 200 nm. The thickness of the insulating part 40b is not less than 50 μm and not more than 100 μm, for example. The thickness of the organic light emitting layer 30 is not less than 50 nm and not more than 500 nm, for example. The thickness of the second electrode 20 (the conductive part 20a) is not less than 10 nm and not more than 300 nm, for example. The width W1 (the length in the X-axis direction) of the conductive part 20a is not less than 1 μm and not more than 500 μm, for example. A pitch Pt1 of each of the plurality of conductive parts 20a is not less than 2 μm and not more than 2000 μm, for example, and more preferably, not less than 2 μm and not more than 200 μm. The pitch Pt1 is the distance in the X-axis direction between the centers in the X-axis direction of the adjacent two conductive parts 20a, for example. The width W2 of the insulating part 40b is not less than 1 μm and not more than 1500 μm, for example. A pitch Pt2 of the insulating part 40b is not less than 2 μm and not more than 2000 μm, for example.

Figure 4A:
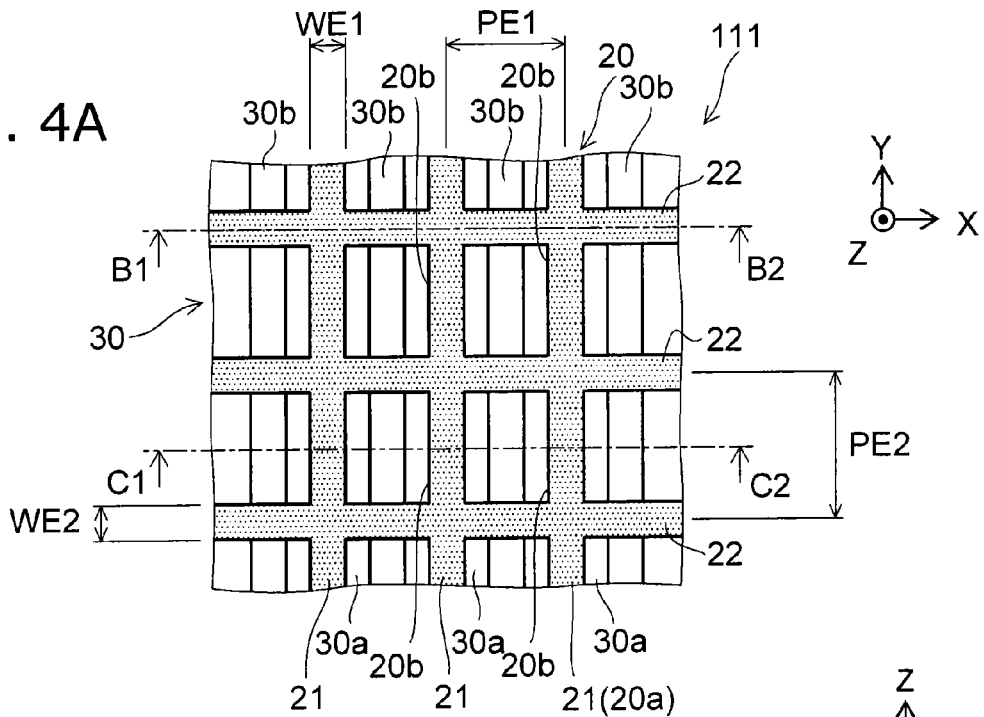
FIGS. 4A to 4C are schematic views showing another organic electroluminescent device according to the first embodiment.
Figure 4B:
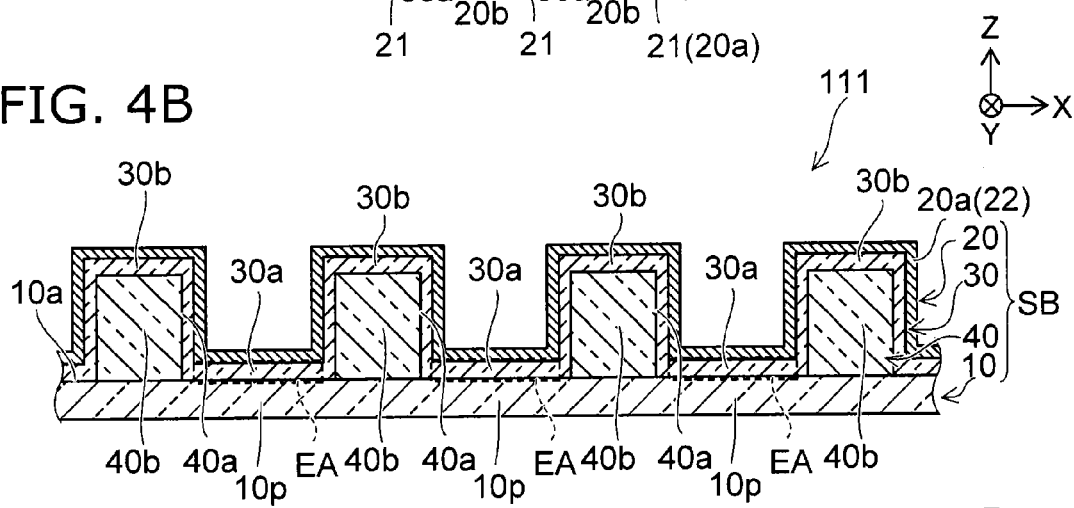
Figure 4C:
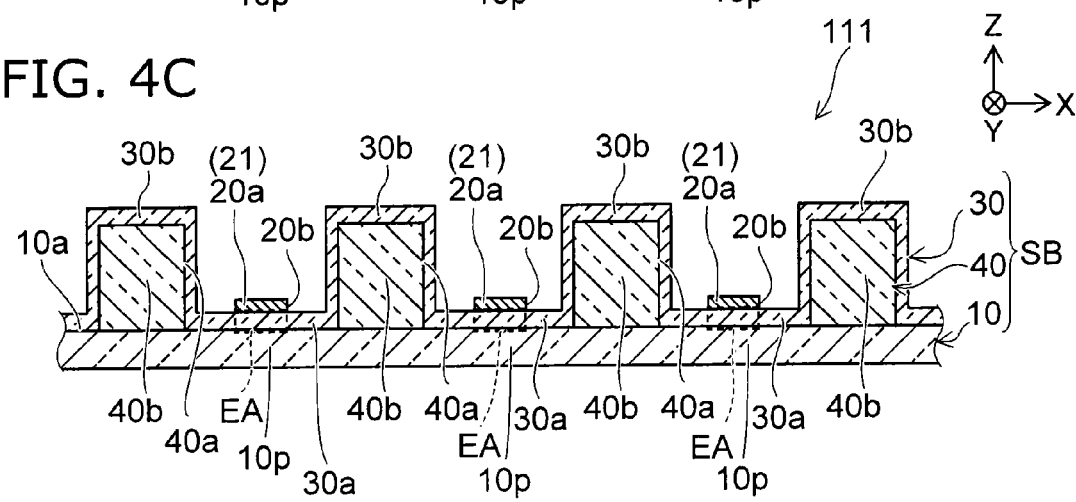

FIGS. 4A to 4C are schematic views showing another organic electroluminescent device according to the first embodiment.

FIG. 4A is a schematic plan view of an organic electroluminescent device 111. FIGS. 4B and 4C are schematic cross-sectional views of the organic electroluminescent device 111. FIG. 4B shows the cross-section along a B1-B2 line of FIG. 4A, and FIG. 4C shows the cross-section along a C1-C2 line of FIG. 4A.

As shown in FIGS. 4A to 4C, in the organic electroluminescent device 111, the second electrode 20 includes one grid-shaped conductive part 20a.

In the second electrode 20 of the organic electroluminescent device 111, each of the plurality of openings 20b is arranged in the Y-axis direction and is also arranged in the X-axis direction. That is, each of the plurality of openings 20b is arranged in a two-dimensional matrix in the X-axis direction and Y-axis direction. The shape of each of the plurality of openings 20b projected onto the X-Y plane is rectangular, for example. As a result, the conductive part 20a is grid-shaped when it is projected onto the X-Y plane. In this example, the pattern shape of the second electrode 20 is grid-shaped. As described above, the pattern shape of the second electrode 20 is not limited to the stripe shape, but may be grid-shaped.

The conductive part 20a includes a plurality of first extension parts 21 and a plurality of second extension parts 22, for example. Each of the plurality of first extension parts 21 extends in the Y-axis direction and is arranged in the X-axis direction. Each of the plurality of second extension parts 22 extends in the X-axis direction and is arranged in the Y-axis direction. Each of the plurality of second extension parts 22 crosses each of the plurality of first extension parts 21. Each of the plurality of first extension parts 21 is disposed, for example, at a position where it overlaps with each of the plurality of first parts 30a when it is projected onto the X-Y plane. As a result, for example as compared with the stripe-shaped second electrode 20, the area of the emission area EA can be increased while narrowing the first extension part 21 and the second extension part 22.

A width WE1 (length in the X-axis direction) of the first extension part 21 is not less than 1 μm and not more than 500 μm, for example. A pitch PE1 of each of the plurality of first extension parts 21 is not less than 2 μm and not more than 2000 μm, for example. The pitch PE1 is the distance in the X-axis direction between the centers in the X-axis direction of the adjacent two first extension parts 21, for example. A width WE2 (length in the Y-axis direction) of the second extension part 22 is not less than 1 μm and not more than 500 μm, for example. A pitch PE2 of each of the plurality of second extension parts 22 is not less than 2 μm and not more than 2000 μm, for example. The pitch PE2 is the distance in the Y-axis direction between the centers in the Y-axis direction of the adjacent two second extension parts 22, for example.

In this example, the shape of the opening 20b projected onto the X-Y plane is rectangular. The shape of the opening 20b is not limited to the rectangular shape, but may be a circular shape, elliptic shape, or other polygonal shape. The shape of the opening 20b may be any shape. In the specification, the "grid shape" includes a grid shape whose opening is rectangular and a grid shape whose opening has any shape. For example, the "grid shape" includes a honeycomb shape and the like. That is, the pattern shape of the second electrode 20 may be a honeycomb shape or the like.

Figure 5A:
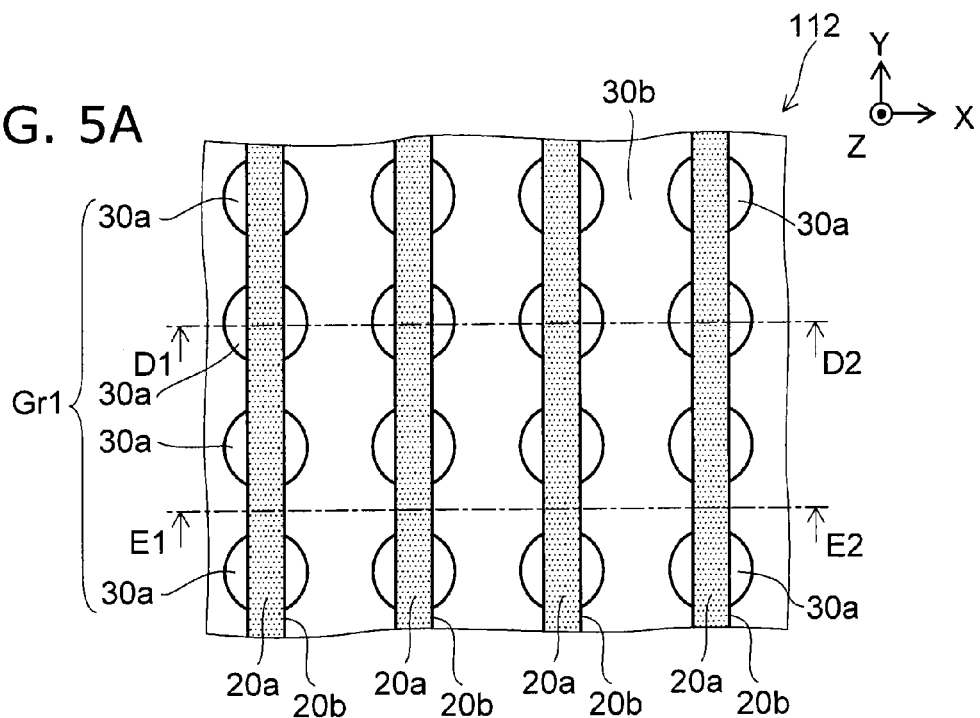
FIGS. 5A to 5C are schematic views showing another organic electroluminescent device according to the first embodiment.
Figure 5B:
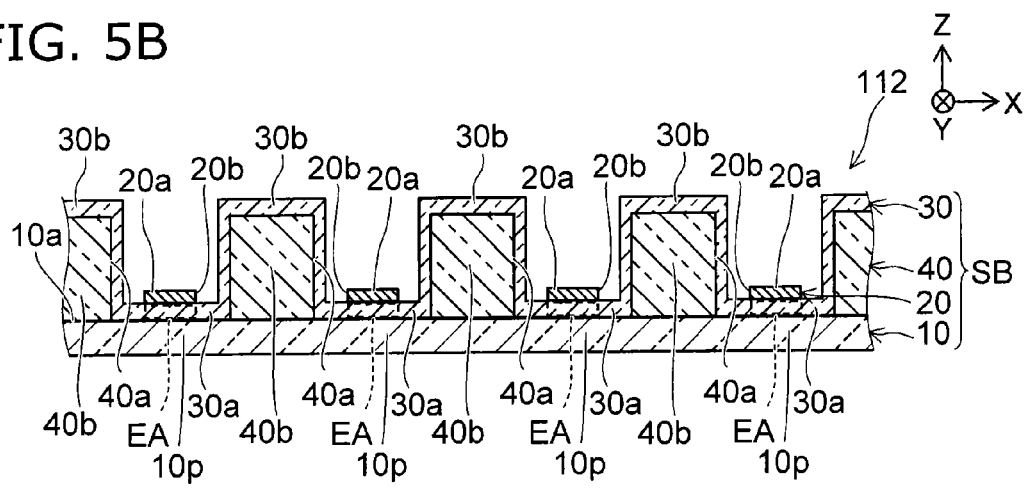
Figure 5C:
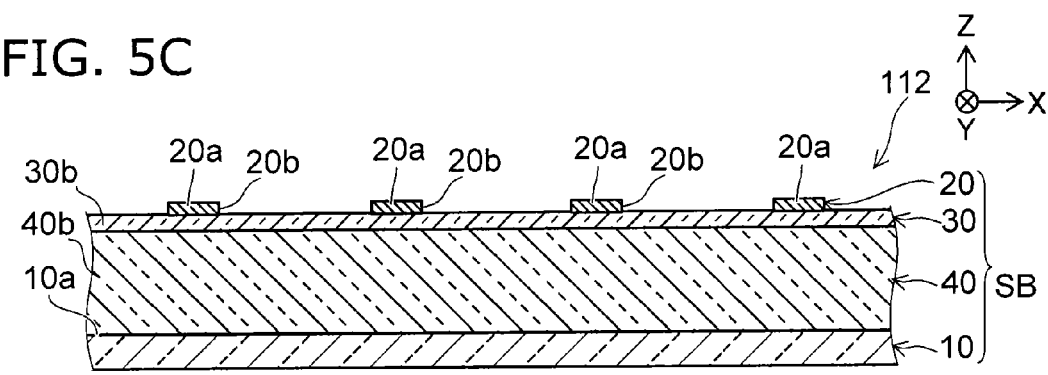

FIGS. 5A to 5C are schematic views showing another organic electroluminescent device according to the first embodiment.

FIG. 5A is a schematic plan view of an organic electroluminescent device 112. FIGS. 5B and 5C are the schematic cross-sectional views of the organic electroluminescent device 112. FIG. 5B shows the cross-section along a D1-D2 line of FIG. 5A, and FIG. 5C shows the cross-section along an E1-E2 line of FIG. 5A.

As shown in FIGS. 5A to 5C, in the organic electroluminescent device 112, the insulating layer 40 includes the plurality of openings 40a arranged in the X-axis direction and Y-axis direction. That is, in the organic electroluminescent device 112, the plurality of openings 40a are arranged in a two-dimensional matrix in the X-axis direction and Y-axis direction. In this example, the shape of the opening 40a projected onto the X-Y plane is circular.

In the organic electroluminescent device 112, the insulating part 40b is grid-shaped when it is projected onto the X-Y plane. The organic light emitting layer 30 includes the plurality of first parts 30a each being provided on each of the plurality of exposed parts 10p and the grid-shaped second part 30b provided on the insulating part 40b. Each of the plurality of conductive parts 20a is disposed, for example, at a position where it overlaps with each of a group Gr1 of first parts 30a arranged in the Y-axis direction among the plurality of first parts 30a when it is projected onto the X-Y plane. Each of the plurality of conductive parts 20a is disposed, for example, at a position where it overlaps with each of a group of openings 40a arranged in the Y-axis direction among the plurality of openings 40a when it is projected onto the X-Y plane. As shown in FIG. 5, the width in the X-axis direction of the opening 40a can be set larger than the width of the conductive part 20a.

Also in the organic electroluminescent device 112, the contacting of the mask or the like with the first part 30a can be suppressed and a high reliability can be obtained.

Figure 6:
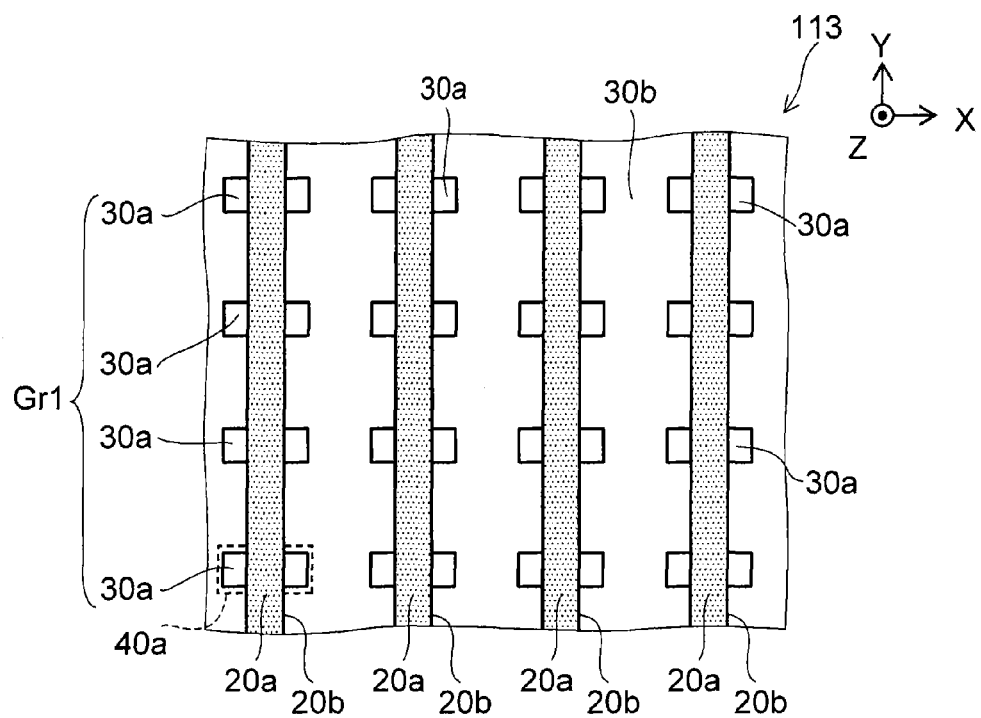
FIG. 6 is a schematic plan view showing another organic electroluminescent device according to the first embodiment.

FIG. 6 is a schematic plan view showing another organic electroluminescent device according to the first embodiment.

As shown in FIG. 6, in an organic electroluminescent device 113, the shape of the opening 40a projected onto the X-Y plane is rectangular. The shape of the opening 40a projected onto the X-Y plane may be any shape, e.g., a circle, an elliptic shape, or a polygonal shape. As shown in FIG. 6, the width in the X-axis direction of the opening 40a can be set larger than the width of the conductive part 20a.

In the organic electroluminescent device 112 and the organic electroluminescent device 113, the pattern shape of the second electrode 20 is a stripe. When the insulating part 40b is grid-shaped, the pattern shape of the second electrode 20 may be grid-shaped.

Figure 7:
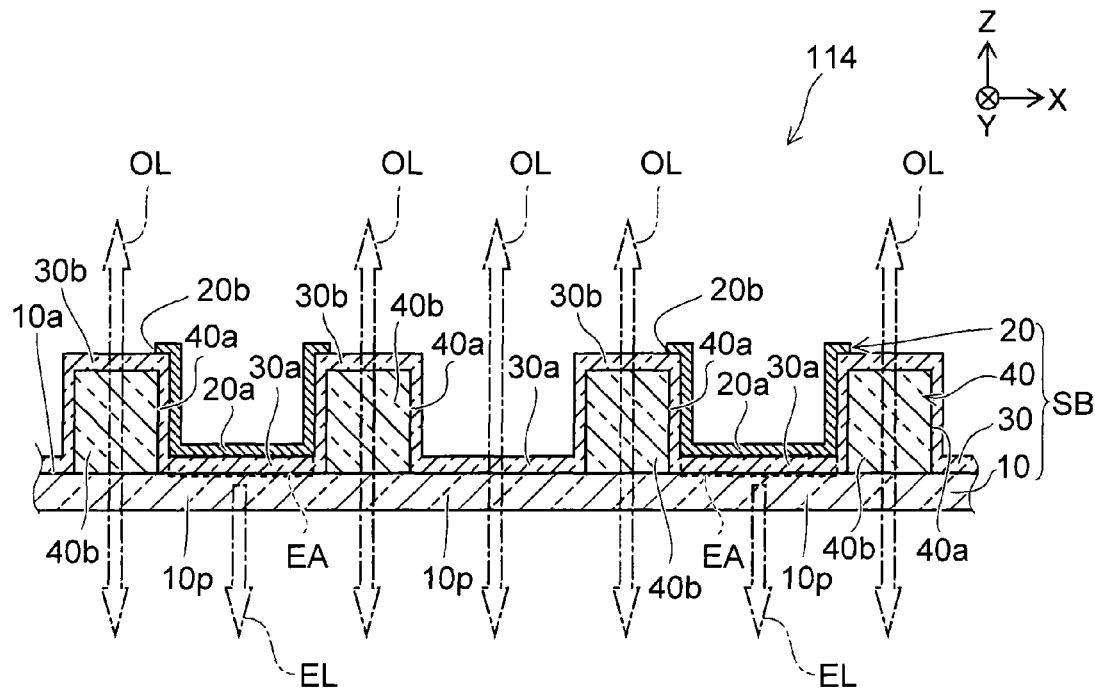
FIG. 7 is a schematic cross-sectional view showing another organic electroluminescent device according to the first embodiment.

FIG. 7 is a schematic cross-sectional view showing another organic electroluminescent device according to the first embodiment.

As shown in FIG. 7, in an organic electroluminescent device 114, each of the plurality of conductive parts 20a extends in the Y-axis direction and is arranged in the X-axis direction. In the organic electroluminescent device 114, when projected onto the X-Y plane, each of the plurality of conductive parts 20a overlaps with one of the plurality of openings 40a of the insulating layer 40. Then, in the organic electroluminescent device 114, when projected onto the X-Y plane, at least one opening 40a is disposed between each of the plurality of conductive parts 20a. In this example, when projected onto the X-Y plane, one opening 40a is disposed between each of the plurality of conductive parts 20a. When projected onto the X-Y plane, the number of openings 40a disposed between each of the plurality of conductive parts 20a may be not less than two.

For example, in the organic electroluminescent device 110, the outside light OL transmits through the insulating part 40b. In contrast, in the organic electroluminescent device 114 according to the embodiment, the outside light OL transmits also through the opening 40a. As a result, in the organic electroluminescent device 114 according to the embodiment, light permeability can be increased as compared with the organic electroluminescent device 110. For example, the transparency can be increased as compared with the organic electroluminescent device 110. For example, the visibility of a transmission image can be increased as compared with the organic electroluminescent device 110.

Figure 8A:
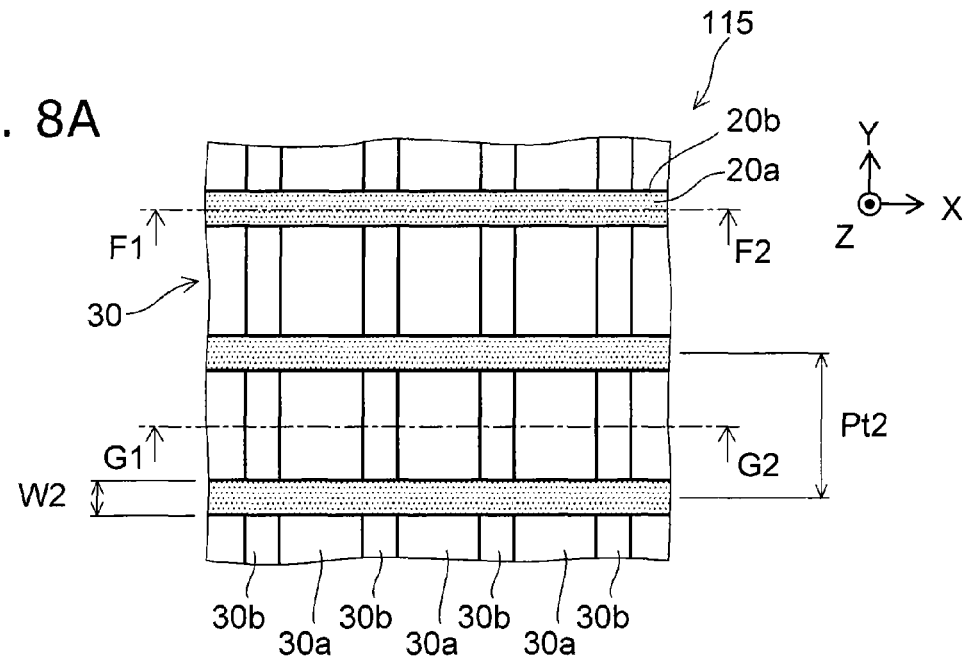
FIGS. 8A to 8C are schematic views showing another organic electroluminescent device according to the first embodiment.
Figure 8B:
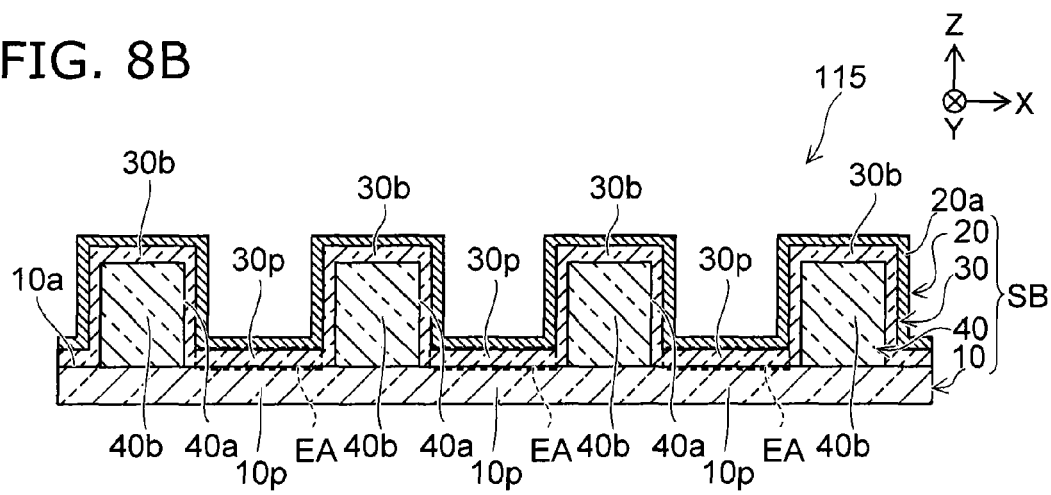
Figure 8C:
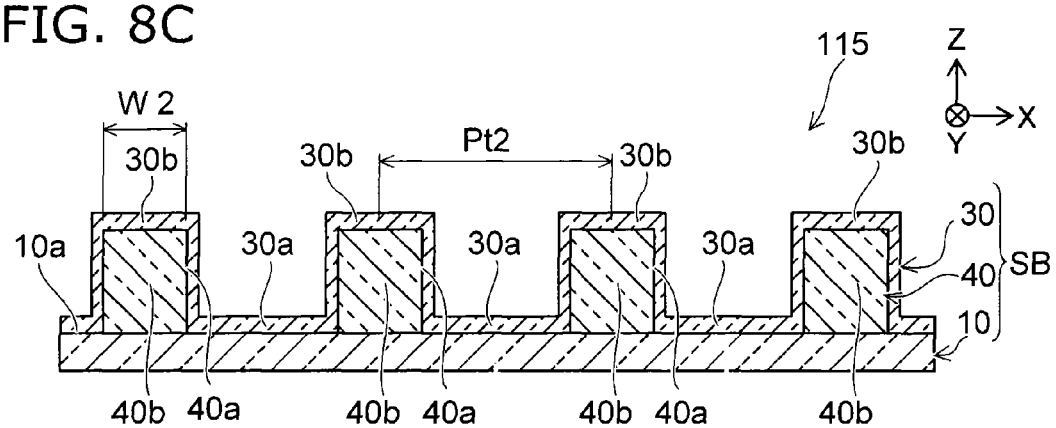

FIGS. 8A to 8C are schematic views showing another organic electroluminescent device according to the first embodiment.

FIG. 8A is a schematic plan view of an organic electroluminescent device 115. FIGS. 8B and 8C are the schematic cross-sectional views of the organic electroluminescent device 115. FIG. 8B shows the cross-section along an F1-F2 line of FIG. 8A, and FIG. 8C shows the cross-section along a G1-G2 line of FIG. 8A.

As shown in FIGS. 8A to 8C, in the organic electroluminescent device 115, each of the plurality of conductive parts 20a of the second electrode 20 extends in the X-axis direction and is arranged in the Y-axis direction. Each of the plurality of openings 20b is disposed between each of the plurality of conductive parts 20a.

When projected onto the X-Y plane, each of the plurality of conductive parts 20a crosses each of the plurality of first parts 30a that extend in the Y-axis direction of the organic light emitting layer 30. When projected onto the X-Y plane, each of the plurality of conductive parts 20a crosses each of the plurality of openings 40a that extend in the Y-axis direction of the insulating layer 40.

In the organic electroluminescent device 115, the width W2 (length in the Y-axis direction) of the conductive part 20a is not less than 1 μm and not more than 500 μm, for example. The pitch Pt2 of each of the plurality of conductive parts 20a is not less than 2 μm and not more than 2000 μm, for example. The pitch Pt2 is the distance in the Y-axis direction between the centers in the Y-axis direction of the adjacent two conductive parts 20a, for example. The width W2 of the insulating part 40b is not less than 1 μm and not more than 1500 μm, for example. The pitch Pt2 of the insulating part 40b is not less than 2 μm and not more than 2000 μm, for example.

Also in the organic electroluminescent device 115, the contacting of the mask or the like with the first part 30a can be suppressed and a high reliability can be obtained. When the width and pitch of the conductive part 20a are the same, in the organic electroluminescent device 115 a decrease in the visibility of a transmission image can be suppressed, for example, as compared with the organic electroluminescent device 110 and the organic electroluminescent device 114.

As described above, in the light transmissive organic electroluminescent device, the width of the conductive part 20a is requested to be reduced in order to make the second electrode 20 be hardly seen. If the width of the conductive part 20a is reduced, the area of the emission area EA will be reduced. Therefore, for example, when the second electrode 20 is formed in a stripe pattern shape, in order to obtain an appropriate emission luminance while making the second electrode 20 be hardly seen, it is necessary to reduce the pitch of each of the plurality of conductive parts 20a while reducing the width of the conductive part 20a. However, if the pitch is reduced, the visibility of a transmission image will decrease, and for example, the transmission image will blur. This may be due to the diffraction of light, for example.

The inventors studied on the relationship between the shape of the second electrode 20, the shape of the insulating layer 40, and the visibility of a transmission image. As a result, the inventors have found that when the width and pitch of the conductive part 20a are the same, a decrease in the visibility of a transmission image can be suppressed in the configuration of the organic electroluminescent device 115 as compared with the configuration of the organic electroluminescent device 114. Each insulating part 40b is caused to cross each conductive part 20a. As a result, the inventors have found that a decrease in the visibility of a transmission image can be suppressed as compared with the configuration, in which each insulating part 40b is formed in a stripe shape parallel to each conductive part 20a and at least one opening 40a is disposed between each conductive part 20a. The inventors have found that the blurring of a transmission image can be suppressed as compared with the organic electroluminescent device 114, for example. This is a new effect derived from the experiments conducted by the inventors.

Moreover, in the organic electroluminescent device 115, the area of the insulating part 40b extending to a portion, through which light transmits, is small as compared with the organic electroluminescent devices 110, 112, and 113, for example. As a result, in the organic electroluminescent device 115, light permeability can be increased as compared with the organic electroluminescent devices 110, 112, and 113. For example, the transparency can be increased as compared with the organic electroluminescent devices 110, 112, and 113. As described above, in the organic electroluminescent device 115 according to the embodiment, the blurring of a transmission image can be suppressed. Furthermore, a decrease in light permeability can be also suppressed. Accordingly, a decrease in the visibility of a transmission image can be suppressed. A high visibility of a transmission image can be obtained.

In the organic electroluminescent device 110, a part of the conductive part 20a may overlap onto the insulating part 40b (see FIG. 1). In the organic electroluminescent device 110, a portion, where the conductive part 20a and the insulating part 40b overlap with each other, contributes to neither the emission of light nor the transmission of light. In the organic electroluminescent device 115, the generation of these non-light-emitting part and non-light-transmission portion can be also suppressed.

In this example, a direction along which the conductive part 20a extends is substantially perpendicular to a direction along which the opening 40a extends. The direction along which the conductive part 20a extends does not necessarily need to be perpendicular to the direction along which the opening 40a extends. The direction along which the conductive part 20a extends may include a component that extends in a direction perpendicular to the direction along which the opening 40a extends, for example. That is, the direction along which the conductive part 20a extends may be a direction that intersects with the direction along which the opening 40a extends. However, as shown in this example, by causing the direction along which the conductive part 20a extends to be substantially orthogonal to the direction along which the opening 40a extends, the complication of the manufacturing process of the organic electroluminescent device can be suppressed, for example. For example, a decrease in the visibility of a transmission image can be appropriately suppressed.

Figure 9A:
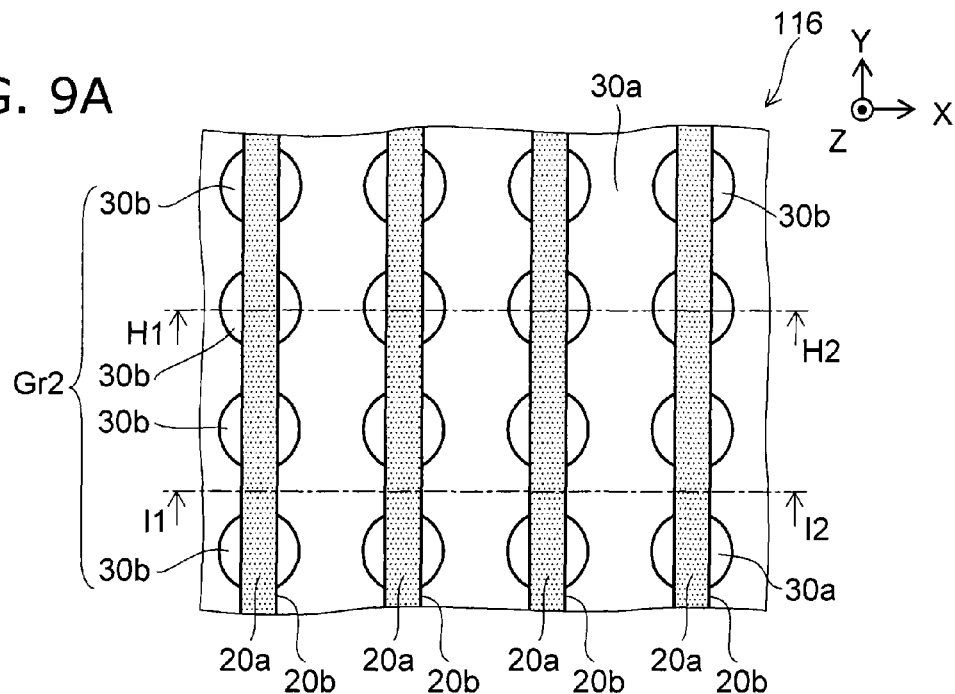
FIGS. 9A to 9C are schematic views showing another organic electroluminescent device according to the first embodiment.
Figure 9B:
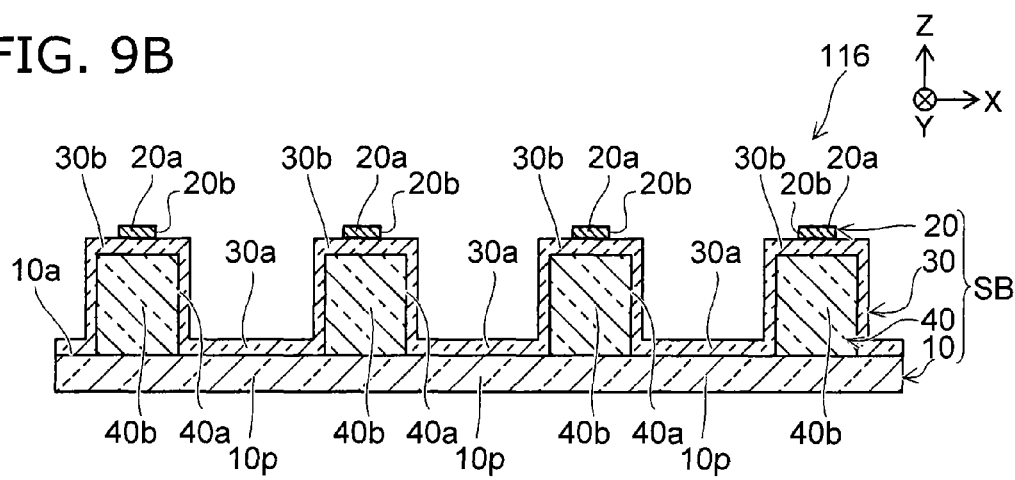
Figure 9C:
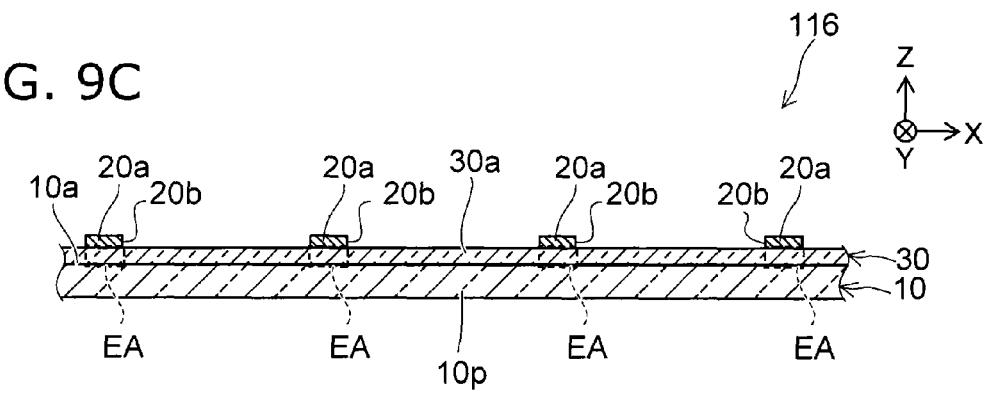

FIGS. 9A to 9C are schematic views showing another organic electroluminescent device according to the first embodiment.

FIG. 9A is a schematic plan view of an organic electroluminescent device 116. FIGS. 9B and 9C are the schematic cross-sectional views of the organic electroluminescent device 116. FIG. 9B shows the cross-section along an H1-H2 line of FIG. 9A, and FIG. 9C shows the cross-section along an I1-I2 line of FIG. 9A.

As shown in FIGS. 9A to 9C, in the organic electroluminescent device 116, the insulating layer 40 includes one grid-shaped opening 40a. In the organic electroluminescent device 116, the opening 40a of the insulating layer 40 is grid-shaped when it is projected onto the X-Y plane. The insulating layer 40 includes a plurality of insulating parts 40b. In this example, each of the plurality of insulating parts 40b is arranged in the X-axis direction and Y-axis direction. That is, each of the plurality of insulating parts 40b is arranged in a two-dimensional matrix in the X-axis direction and Y-axis direction. In this example, the shape of the insulating part 40b projected onto the X-Y plane is circular. In the organic electroluminescent device 116, the opening 40a is grid-shaped when it is projected onto the X-Y plane. The organic light emitting layer 30 includes one first part 30a provided on one exposed part 10p and the plurality of second parts 30b each being provided on each of the plurality of insulating parts 40b. In this example, the exposed parts 10p and first parts 30a are also grid-shaped.

Each of the plurality of conductive parts 20a is disposed, for example, at a position where it overlaps with each of a group Gr2 of second parts 30b arranged in the Y-axis direction among the plurality of second parts 30b when it is projected onto the X-Y plane. Each of the plurality of conductive parts 20a is disposed, for example, at a position it overlaps with each of a group of insulating parts 40b arranged in the Y-axis direction among the plurality of insulating parts 40b when it is projected onto the X-Y plane. As shown in FIG. 9A, the width in the X-axis direction of the insulating part 40b can be made larger than the width of the conductive part 20a.

Also in the organic electroluminescent device 116, the contacting of the mask or the like with the first part 30a can be suppressed and a high reliability can be obtained. When the width and pitch of the conductive part 20a are the same, in the organic electroluminescent device 116 a decrease in the visibility of a transmission image can be suppressed as compared with the organic electroluminescent device 110.

In the organic electroluminescent device 116, the area of the insulating part 40b extending to a portion, through which light transmits, is small as compared with the organic electroluminescent devices 112 and 113. As a result, in the organic electroluminescent device 116, light permeability can be increased as compared with the organic electroluminescent devices 112 and 113. For example, the transparency can be increased as compared with the organic electroluminescent devices 112 and 113. In the organic electroluminescent device 116, as with the organic electroluminescent device 115, the generation of the non-light-emitting part and non-light-transmission portion which contribute to neither the emission of light nor the transmission of light can be suppressed.

Figure 10:
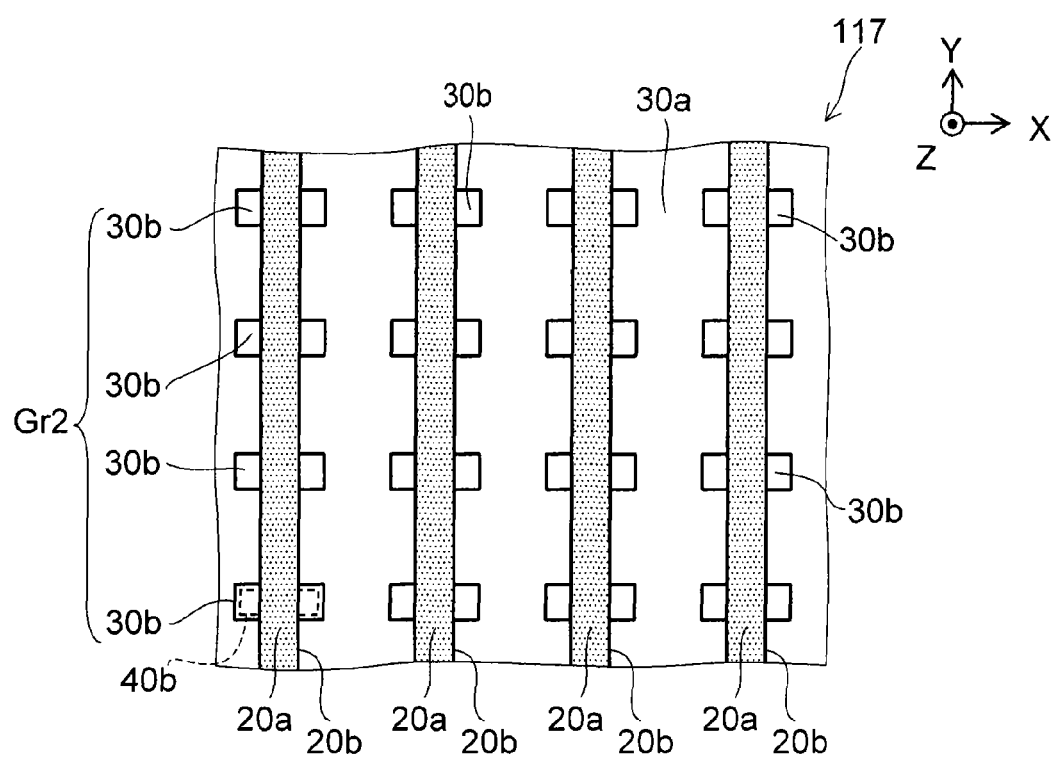
FIG. 10 is a schematic plan view showing another organic electroluminescent device according to the first embodiment.

FIG. 10 is a schematic plan view showing another organic electroluminescent device according to the first embodiment.

As shown in FIG. 10, in the organic electroluminescent device 117, the shape of the insulating part 40b projected onto the X-Y plane is rectangular. The shape of the insulating part 40b projected onto the X-Y plane may be any shape, e.g., a circle, an elliptic shape, or a polygonal shape. As shown in FIG. 10, the width in the X-axis direction of the insulating part 40b can be made larger than the width of the conductive part 20a.

Figure 11A:
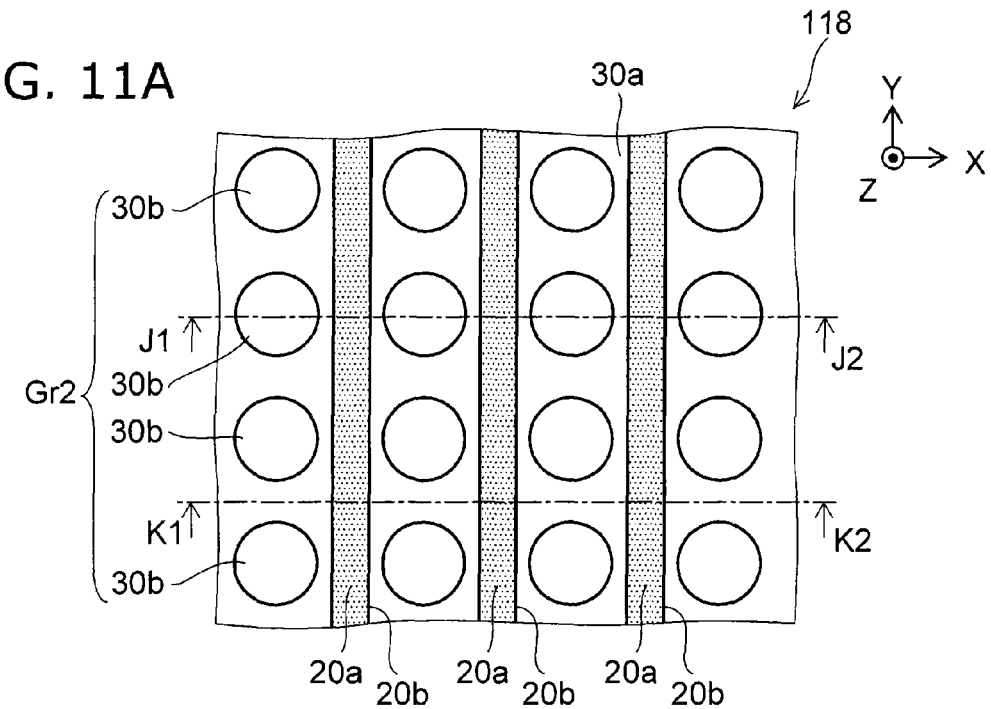
FIGS. 11A to 11C are schematic views showing another organic electroluminescent device according to the first embodiment.
Figure 11B:
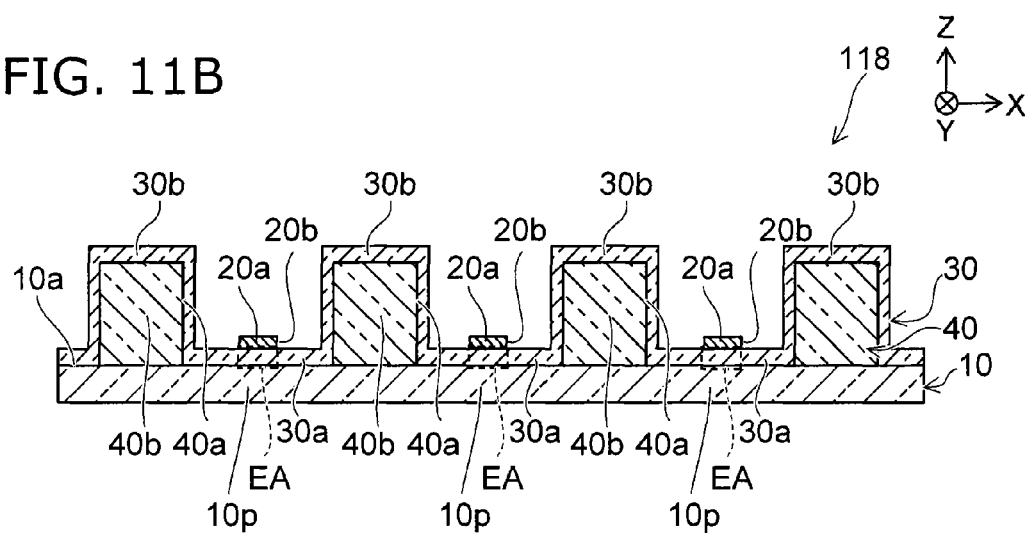
Figure 11C:
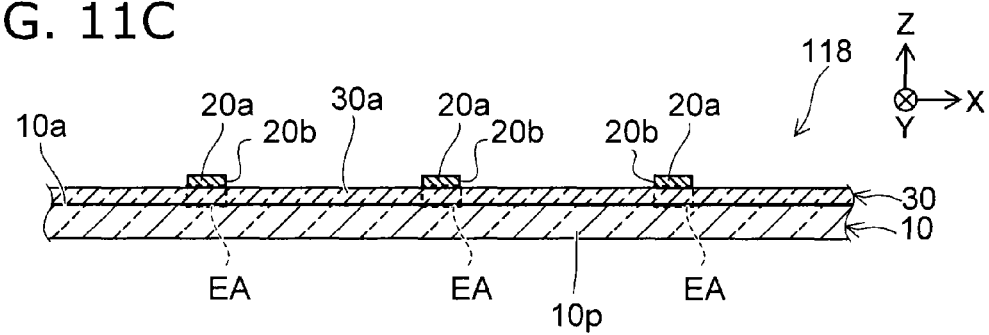

FIGS. 11A to 11C are schematic views showing another organic electroluminescent device according to the first embodiment.

FIG. 11A is a schematic plan view of an organic electroluminescent device 118. FIGS. 11B and 11C are the schematic cross-sectional views of the organic electroluminescent device 118. FIG. 11B shows the cross-section along a J1-J2 line of FIG. 11A, and FIG. 11C shows the cross-section along a K1-K2 line of FIG. 11A.

As shown in FIGS. 11A to 11C, in the organic electroluminescent device 118, each of the plurality of conductive parts 20a is disposed at a position where it does not overlap with each of the group Gr2 of second parts 30b arranged in the Y-axis direction among the plurality of second parts 30b when it is projected onto the X-Y plane. At least a part of each of the plurality of conductive parts 20a is disposed, for example, at a position where it does not overlap with each of the group of insulating parts 40b arranged in the Y-axis direction among the plurality of insulating parts 40b when it is projected onto the X-Y plane. Each of the plurality of conductive parts 20a may be disposed, for example, between each of the group of insulating parts 40b arranged in the Y-axis direction among the plurality of insulating parts 40b when it is projected onto the X-Y plane. Alternatively, a part of each of the plurality of conductive parts 20a may be disposed at a position where it overlaps with each of the plurality of insulating parts 40b.

As described above, when the opening 40a is grid-shaped, the conductive part 20a may be disposed at a position where it does not overlap with the insulating part 40b and second part 30b. In the organic electroluminescent device 118, the area of the emission area EA can be increased, for example, as compared with the organic electroluminescent devices 116 and 117.

Figure 12A:
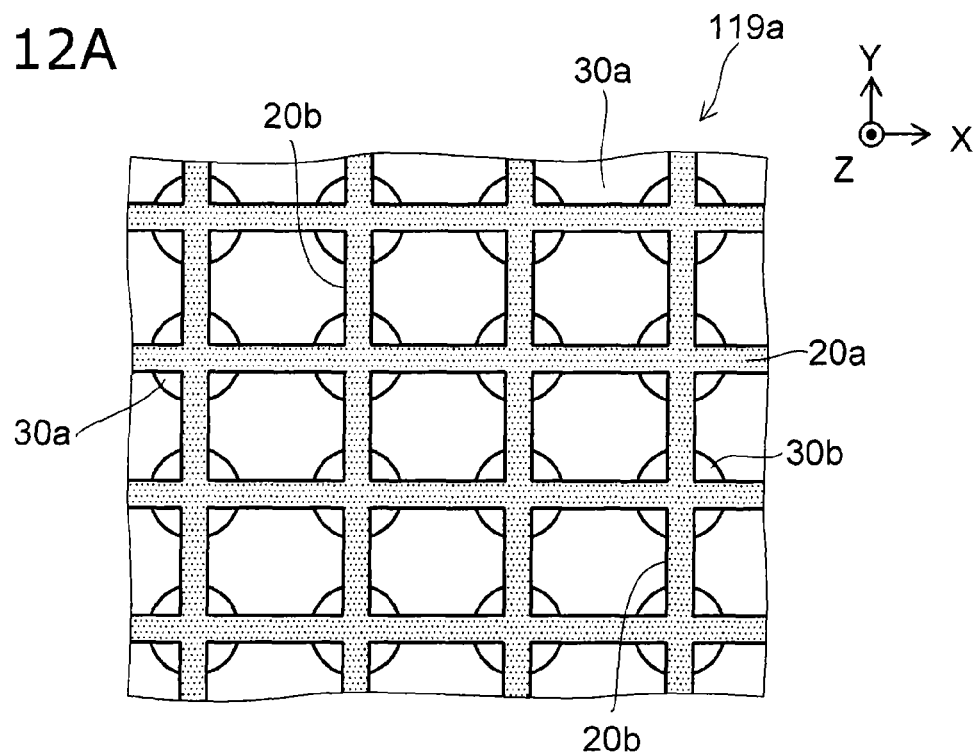
FIGS. 12A and 12B are the schematic plan view showing another organic electroluminescent device according to the first embodiment.
Figure 12B:
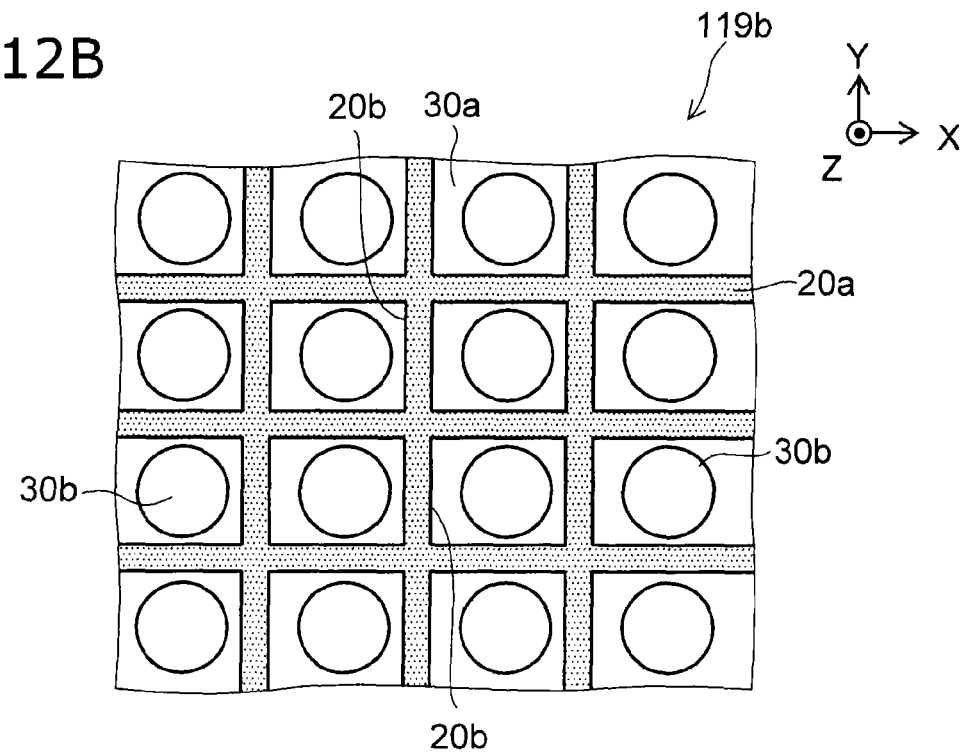

FIGS. 12A and 12B are the schematic plan view showing another organic electroluminescent device according to the first embodiment.

As shown in FIGS. 12A and 12B, in organic electroluminescent devices 119a and 119b, the pattern shape of the second electrode 20 is grid-shaped. As described above, when the opening 40a is grid-shaped, the second electrode 20 may be grid-shaped.

In the organic electroluminescent device 119a, the conductive part 20a is disposed at a position where it overlaps with each of the plurality of second parts 30b and each of the plurality of insulating parts 40b when it is projected onto the X-Y plane.

On the other hand, in the organic electroluminescent device 119b the conductive part 20a is disposed at a position where it does not overlap with each of the plurality of second parts 30b and each of the plurality of insulating parts 40b when it is projected onto the X-Y plane.

As described above, the grid-shaped conductive part 20a may be disposed at a position where it overlaps with each of the plurality of second parts 30b and each of the plurality of insulating parts 40b, or may be disposed at a position where it does not overlap with each of the plurality of second parts 30b and each of the plurality of insulating parts 40b.

Figure 13A:
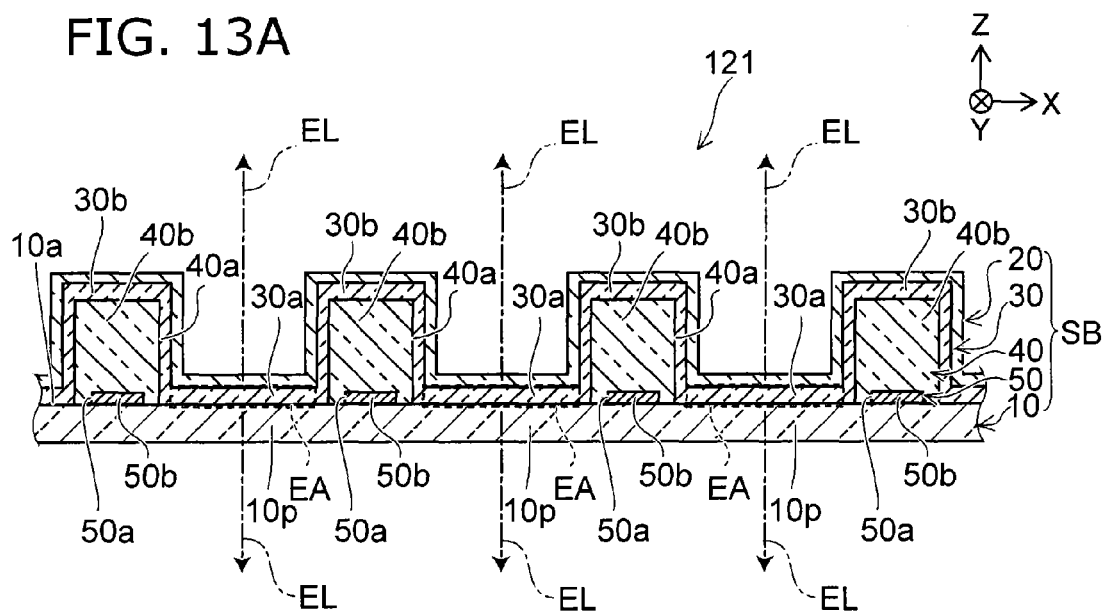
FIGS. 13A and 13B are schematic views showing another organic electroluminescent device according to the first embodiment.
Figure 13B:
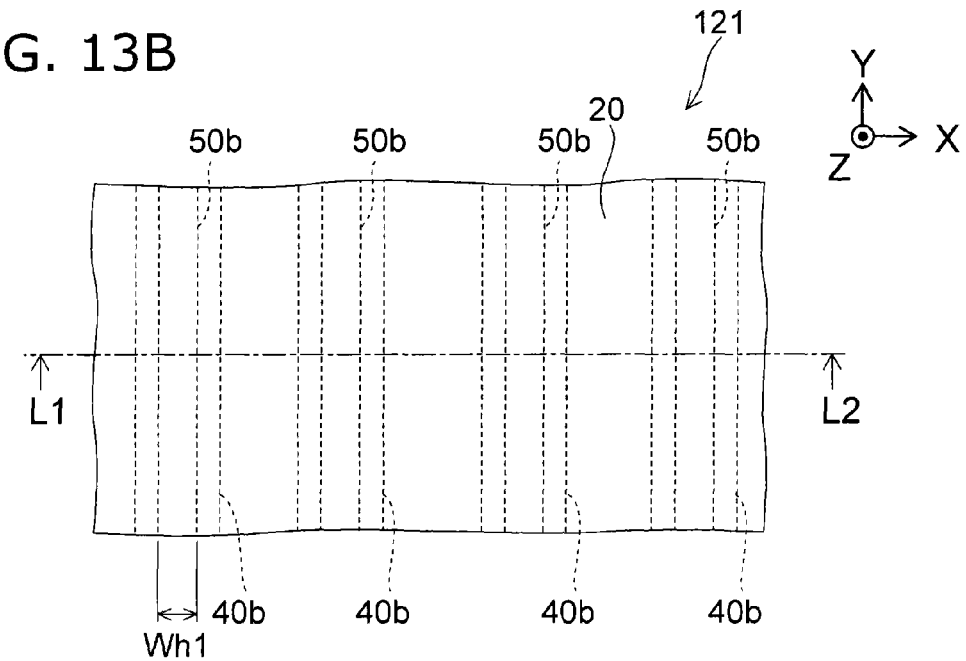

FIGS. 13A and 13B are schematic views showing another organic electroluminescent device according to the first embodiment.

FIG. 13A is a schematic cross-sectional view of an organic electroluminescent device 121, and FIG. 13B is a schematic plan view of the organic electroluminescent device 121. FIG. 13A shows the cross-section along an L1-L2 line of FIG. 13B.

As shown in FIGS. 13A and 13B, in the organic electroluminescent device 121 the second electrode 20 is provided on the organic light emitting layer 30. For example, the second electrode 20 is provided on the whole organic light emitting layer 30. In this example, the second electrode 20 has light permeability. The second electrode 20 is transparent, for example.

As a result, in the organic electroluminescent device 121, when a voltage is applied to the organic light emitting layer 30 via the first electrode 10 and the second electrode 20, the electroluminescence EL radiated from the emission area EA is emitted to the outside of the organic electroluminescent device 121 through the first electrode 10 and is also emitted to the outside of the organic electroluminescent device 121 through the second electrode 20. That is, the organic electroluminescent device 121 is of a double-sided light emitting type.

In the organic electroluminescent device 121, the stacked body SB further includes a first wiring layer 50. The first wiring layer 50 is provided between the first electrode 10 and the insulating layer 40. The first wiring layer 50 includes an opening 50a and a wiring part 50b. The opening 50a exposes a part of the first electrode 10. The first wiring layer 50 includes a plurality of openings 50a and a plurality of wiring parts 50b, for example. In this example, each of the plurality of openings 50a extends in the Y-axis direction and is arranged in the X-axis direction. Each of the plurality of wiring parts 50b is provided between each of the plurality of openings 50a. That is, in this example, the first wiring layer 50 has a stripe pattern shape. Each of the plurality of wiring parts 50b is disposed, for example, at a position where it overlaps with each of the plurality of insulating parts 40b when it is projected onto the X-Y plane. Each of the plurality of wiring parts 50b does not necessarily need to overlap with each of the plurality of insulating parts 40b.

The first wiring layer 50 is electrically connected to the first electrode 10. The first wiring layer 50 is in contact with the first electrode 10, for example. The conductivity of the first wiring layer 50 is higher than the conductivity of the first electrode 10. The first wiring layer 50 has light reflectivity. The optical reflectance of the first wiring layer 50 is higher than the optical reflectance of the first electrode 10. The first wiring layer 50 is metal wirings, for example. The first wiring layer 50 functions as an auxiliary electrode that transmits the electric current flowing through the first electrode 10, for example. As a result, in the organic electroluminescent device 121, for example the amount of current flowing in the direction parallel to the upper face 10a of the first electrode 10 can be made more uniform. For example, the in-plane emission luminance can be made more uniform.

A width Wh1 (length in the X-axis direction) of the wiring part 50b is not less than 0.5 μm and not more than 400 μm, for example. In this example, the pitch of each of the plurality of wiring parts 50b is substantially the same as the pitch of each of the plurality of insulating parts 40b. The pitch of each of the plurality of wiring parts 50b may be an integral multiple of the pitch of each of the plurality of insulating parts 40b, for example. That is, every one or every two wiring parts 50b may be provided with respect to the insulating part 40b. The first wiring layer 50 may be provided in the surface opposite the upper face 10a of the first electrode 10. The pattern shape of the first wiring layer 50 may be grid-shaped. Even when the insulating layer 40 is grid-shaped, the first wiring layer 50 can be formed in a stripe shape or in a grid shape. The first wiring layer 50 can be disposed so as to be covered with the insulating layer 40.

Also in the organic electroluminescent device 121, the contacting of the mask or the like with the first part 30a can be suppressed and a high reliability can be obtained.

For the light transmissive second electrode 20, the materials described with respect to the first electrode 10 can be used, for example. Moreover, for the light transmissive second electrode 20, a metallic material, such as MgAg, may be used, for example. In the metallic material, the thickness of the second electrode 20 is set not less than 5 nm and not more than 20 nm. As a result, appropriate light permeability can be obtained.

The first wiring layer 50 contains at least any one element selected from the group consisted of Mo, Ta, Nb, Al, Ni, and Ti, for example. The first wiring layer 50 can be a mixed film containing the elements selected from this group, for example. The first wiring layer 50 can be a stacked film containing these elements. For the first wiring layer 50, a stacked film of Nb/Mo/Al/Mo/Nb can be used, for example. The first wiring layer 50 functions as an auxiliary electrode for suppressing a drop in the potential of the first electrode 10, for example. The first wiring layer 50 can function as a lead electrode for supplying electric current. The material of the first wiring layer 50 is not limited to these materials.

Figure 14A:
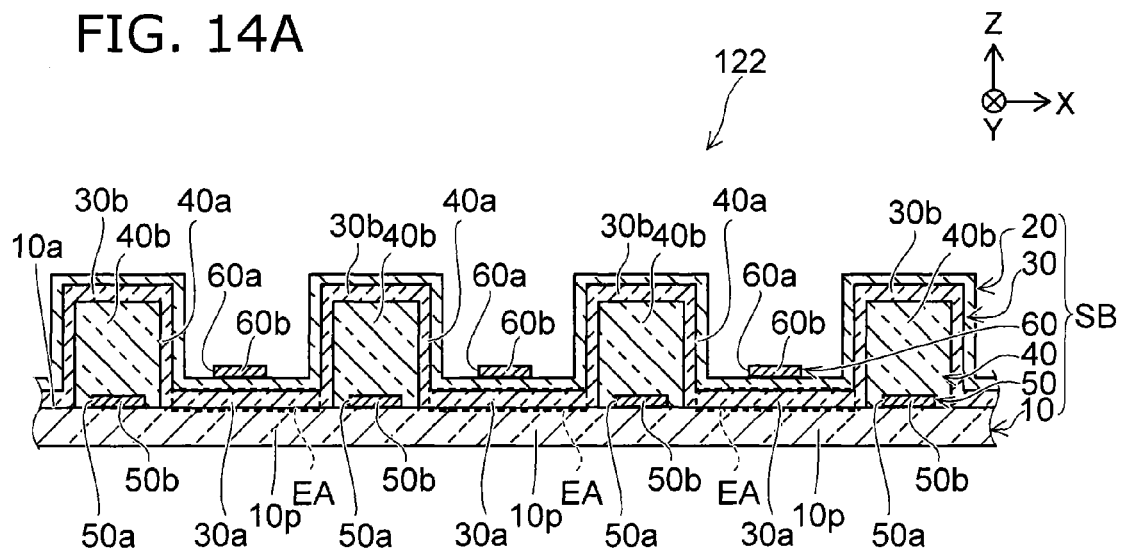
FIGS. 14A and 14B are schematic views showing another organic electroluminescent device according to the first embodiment.
Figure 14B:
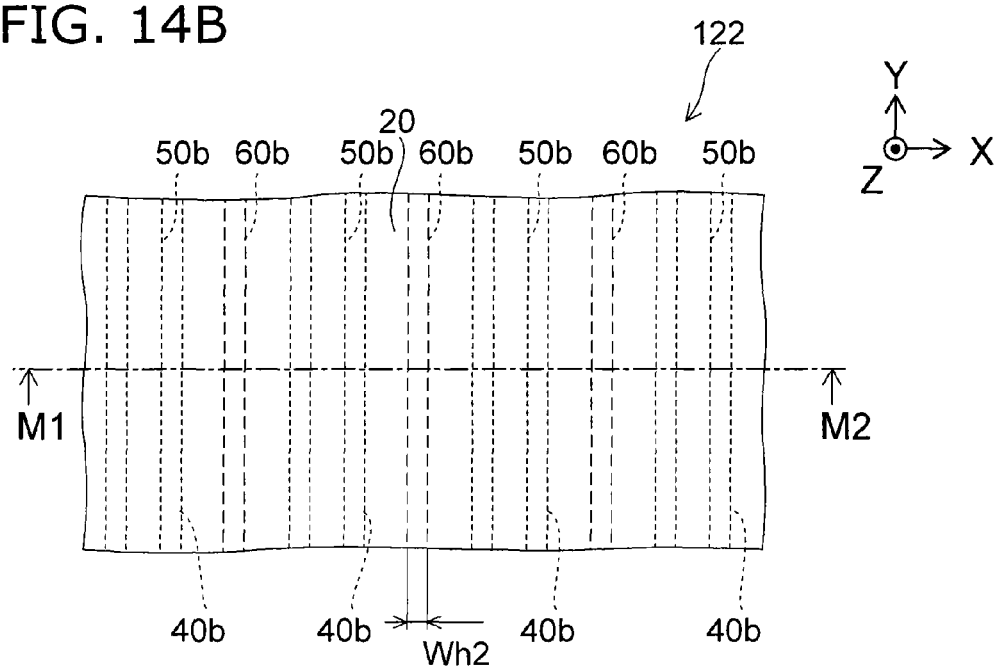

FIGS. 14A and 14B are schematic views showing another organic electroluminescent device according to the first embodiment.

FIG. 14A is a schematic cross-sectional view of the organic electroluminescent device 121, and FIG. 14B is a schematic plan view of the organic electroluminescent device 121. FIG. 14A shows the cross-section along an L1-L2 line of FIG. 14B.

As shown in FIGS. 14A and 14B, in the organic electroluminescent device 122, the stacked body SB further includes a second wiring layer 60. The second wiring layer 60 is provided on the second electrode 20. The second wiring layer 60 includes an opening 60a and a wiring part 60b. The opening 60a exposes a part of the second electrode 20. The second wiring layer 60 includes a plurality of openings 60a and a plurality of wiring parts 60b, for example. In this example, each of the plurality of openings 60a extends in the Y-axis direction and is arranged in the X-axis direction. Each of the plurality of wiring parts 60b is provided between each of the plurality of openings 60a. That is, in this example, the second wiring layer 60 has a stripe pattern shape. In this example, each of the plurality of wiring parts 60b is disposed at a position where it does not overlap with each of the plurality of insulating parts 40b when it is projected onto the X-Y plane. Each of the plurality of wiring parts 60b may be disposed at a position where it overlaps with each of the plurality of insulating parts 40b when it is projected onto the X-Y plane.

The second wiring layer 60 is electrically connected to the second electrode 20. The second wiring layer 60 is in contact with the second electrode 20, for example. The conductivity of the second wiring layer 60 is higher than the conductivity of the second electrode 20. The second wiring layer 60 has light reflectivity. The optical reflectance of the second wiring layer 60 is higher than the optical reflectance of the second electrode 20. The second wiring layer 60 is metal wirings, for example. The second wiring layer 60 functions as an auxiliary electrode for transmitting the electric current flowing into the second electrode 20, for example. As a result, in the organic electroluminescent device 122, for example the amount of current flowing in the X-Y plane direction of the second electrode 20 can be made more uniform. For example, the in-plane emission luminance can be made more uniform.

A width Wh2 (length in the X-axis direction) of the wiring part 60b is not less than 0.5 μm and not more than 400 μm, for example. In this example, each of the plurality of wiring parts 60b is disposed at a position where it overlaps with each of the plurality of first parts 30a when it is projected onto the X-Y plane. Every one or every two wiring parts 60b may be provided with respect to the first part 30a, for example.

The second wiring layer 60 may be provided between the second electrode 20 and the organic light emitting layer 30, for example. The pattern shape of the second wiring layer 60 may be grid-shaped. For the second wiring layer 60, the materials described with respect to the first wiring layer 50 can be used, for example.

Also in the organic electroluminescent device 122, the contacting of the mask or the like with the first part 30a can be suppressed and a high reliability can be obtained. Even when the insulating layer 40 is grid-shaped, the second wiring layer 60 can be formed in a stripe shape or in a grid shape. Each of the plurality of second wiring layers 60 is disposed at a position where it does not overlap with each of the plurality of insulating parts 40b when it is projected onto the X-Y plane. Each of the plurality of second wiring parts 60a may be disposed at a position where it overlaps with each of the plurality of insulating parts 40b, for example.

Figure 15:
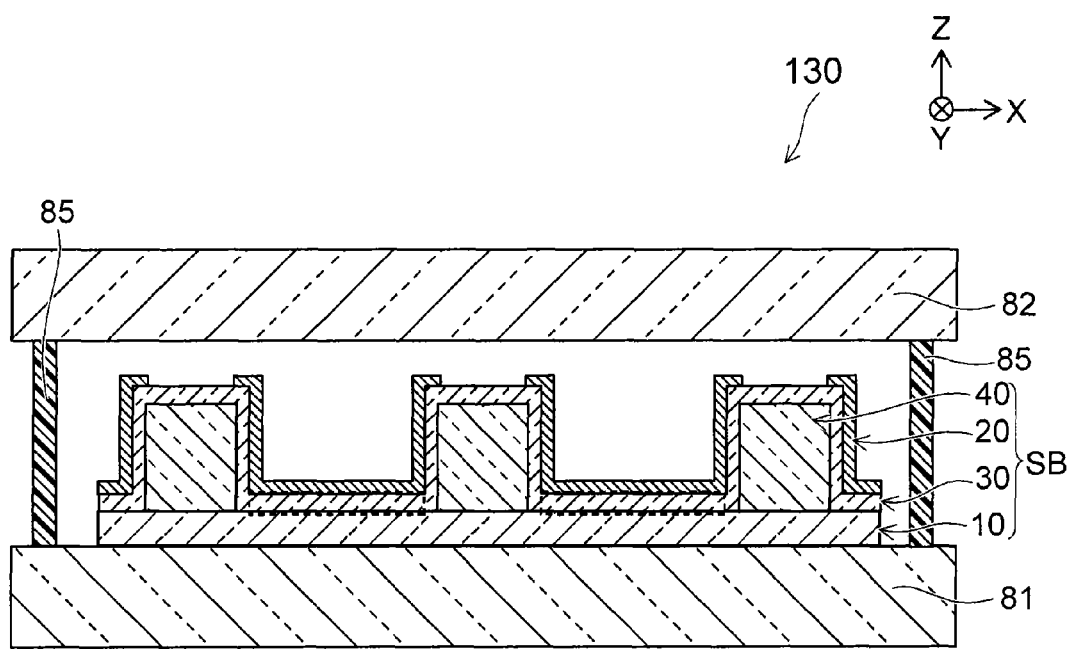
FIG. 15 is a schematic cross-sectional view showing another organic electroluminescent device according to the first embodiment.

FIG. 15 is a schematic cross-sectional view showing another organic electroluminescent device according to the first embodiment.

As shown in FIG. 15, an organic electroluminescent device 130 further includes a first substrate 81, a second substrate 82, and a seal part 85. The first electrode 10 is provided on the first substrate 81. The stacked body SB is provided on the first substrate 81. The first substrate 81 has light permeability. The second substrate 82 is provided on the stacked body SB, and faces the first substrate 81. The second substrate 82 has light permeability. In this example, the configuration of the stacked body SB is the same as the configuration described with respect to the organic electroluminescent device 110. The configuration of the stacked body SB may be the configurations described with respect to the organic electroluminescent devices 111 to 118, 119a, 119b, 121, and 122.

The seal part 85 is annularly provided along the outer edges of the first substrate 81 and the second substrate 82 and bonds the first substrate 81 and the second substrate 82. As a result, the stacked body SB is sealed by the first substrate 81 and the second substrate 82. In the organic electroluminescent device 130, the distance in the Z-axis direction between the first substrate 81 and the second substrate 82 is defined by the seal part 85. This configuration can be realized, for example, by including a granular spacer (the illustration is omitted) in the seal part 85. For example, a plurality of granular spacers are distributed in the seal part 85, so that the distance between the first substrate 81 and the second substrate 82 is defined by the diameters of the plurality of spacers.

In the organic electroluminescent device 130, the thickness (length along the Z-axis direction) of the seal part 85 is not less than 1 μm and not more than 100 μm, for example, and more preferably, not less than 5 μm and not more than 20 μm, for example. As a result, for example, the infiltration of moisture and the like can be suppressed. The thickness of the seal part 85 is substantially the same as the diameter of the spacer distributed in the seal part 85, for example.

In the organic electroluminescent device, a recessed portion for housing the stacked body SB may be provided in the second substrate 82. This configuration makes the formation of the second substrate 82 difficult. For example, this configuration will increase the cost of the organic electroluminescent device.

In contrast, in the organic electroluminescent device 130 according to the embodiment, the distance between the first substrate 81 and the second substrate 82 is defined by the seal part 85. As a result, a tabular second substrate 82 can be used, for example. The second substrate 82 can be easily formed, for example. An increase in cost of the organic electroluminescent device 130 can be suppressed.

Inert gas or the like is filled in the space between the stacked body SB and the second substrate 82, for example. A drying agent or the like may be provided between the stacked body SB and the second substrate 82. The space between the stacked body SB and the second substrate 82 may be an air layer, for example. A liquid acrylic resin, epoxy resin, or the like may be filled in the space between the stacked body SB and the second substrate 82, for example. Calcium oxide, barium oxide, or the like may be added into the acrylic resin or epoxy resin, as the drying agent.

For the first substrate 81 and the second substrate 82, a glass substrate or a resin substrate is used, for example. For the seal part 85, an ultraviolet curing resin or the like is used, for example.

Second Embodiment

Figure 16:
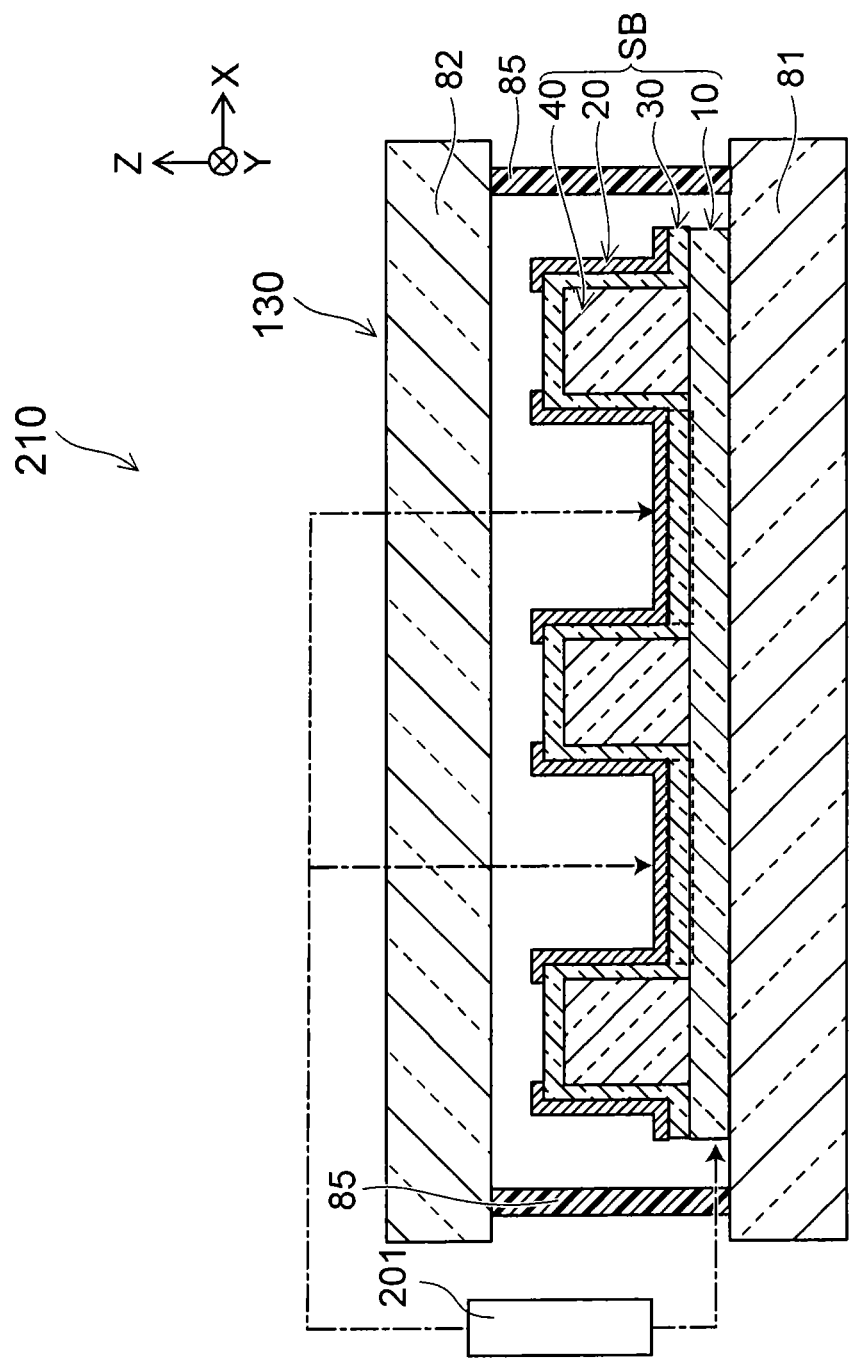
FIG. 16 is a schematic view showing an illumination apparatus according to a second embodiment.

FIG. 16 is a schematic view showing an illumination apparatus according to a second embodiment.

As shown in FIG. 16, an illumination apparatus 210 according to the embodiment includes the organic electroluminescent device (e.g., organic electroluminescent device 130) according to the first embodiment, and a power source 201.

The power source 201 is electrically connected to the first electrode 10 and the second electrode 20. The power source 201 supplies electric current to the organic light emitting layer 30 through the first electrode 10 and the second electrode 20.

The illumination apparatus 210 according to the embodiment can provide a reliable illumination apparatus.

Third Embodiment

Figure 17A:
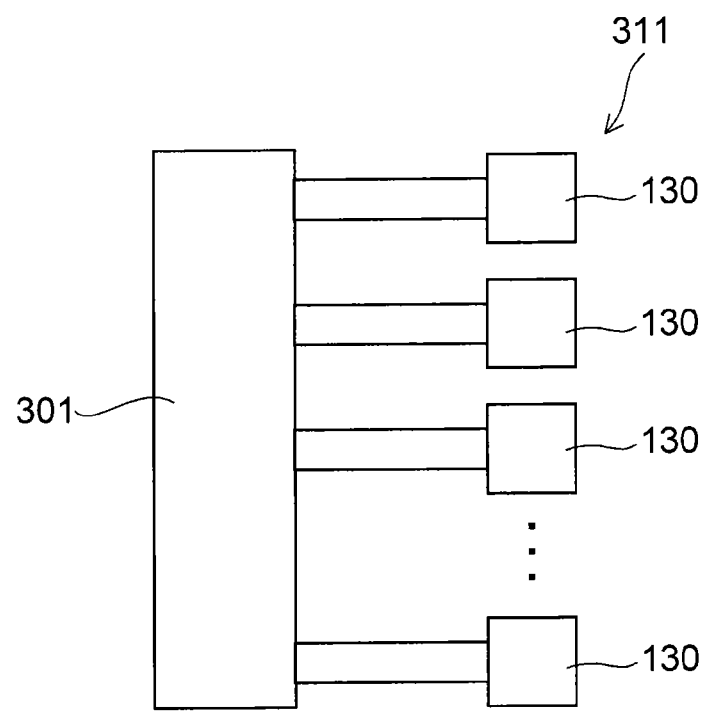
FIGS. 17A and 17B are schematic views showing an illumination system according to a third embodiment.
Figure 17B:
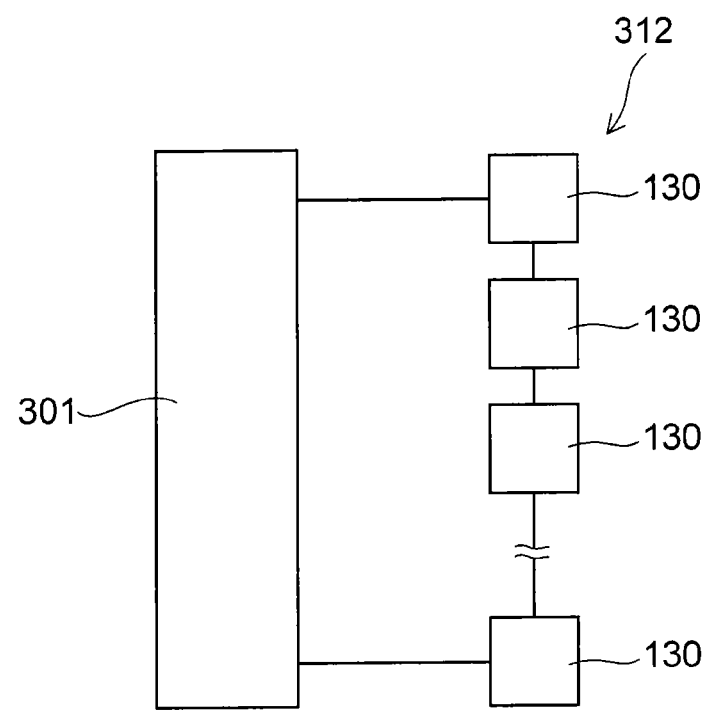

FIGS. 17A and 17B are schematic views showing an illumination system according to a third embodiment.

As shown in FIG. 17A, an illumination system 311 according to the embodiment includes a plurality of organic electroluminescent devices (e.g., organic electroluminescent device 130) according to the first embodiment, and a controller 301.

The controller 301 is electrically connected to each of the plurality of organic electroluminescent devices 130, and controls to turn on and turn off each of the plurality of organic electroluminescent devices 130. The controller 301 is electrically connected to the first electrode 10 and second electrode 20 of each of the plurality of organic electroluminescent devices 130, for example. As a result, the controller 301 individually controls to turn on and turn off each of the plurality of organic electroluminescent devices 130.

As shown in FIG. 17B, in an illumination system 312, each of the plurality of organic electroluminescent devices 130 is connected in series. The controller 301 is electrically connected to the first electrode 10 of one organic electroluminescent device 130 of the plurality of organic electroluminescent devices 130. Then, the controller 301 is electrically connected to the second electrode 20 of another organic electroluminescent device 130 of the plurality of organic electroluminescent devices 130. As a result, the controller 301 collectively controls to turn on and turn off each of the plurality of organic electroluminescent devices 130. As described above, the controller 301 may individually control to turn on and turn off each of the plurality of organic electroluminescent devices 130, or may collectively control the plurality of organic electroluminescent devices 130.

The illumination systems 311 and 312 according to the embodiment can provide an illumination system having high reliability.

According to the embodiments, reliable organic electroluminescent devices, illumination apparatuses, and illumination systems are provided.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Hereinabove, embodiments of the invention are described with reference to specific examples. However, the embodiments of the invention are not limited to these specific examples. For example, one skilled in the art may similarly practice the invention by appropriately selecting specific configurations of components included in organic electroluminescent devices, illumination apparatuses, and illumination systems such as first electrodes, second electrodes, organic light emitting layers, insulating layers, first wiring layers, second wiring layers, power sources, controllers, etc., from known art; and such practice is included in the scope of the invention to the extent that similar effects are obtained.

Further, any two or more components of the specific examples may be combined within the extent of technical feasibility and are included in the scope of the invention to the extent that the purport of the invention is included.

Moreover, all organic electroluminescent devices, illumination apparatuses, and illumination systems practicable by an appropriate design modification by one skilled in the art based on the organic electroluminescent devices, illumination apparatuses, and illumination systems described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:
1. An organic electroluminescent device, comprising:
a first electrode, the first electrode being light transmissive;
an insulating layer provided on the first electrode, the insulating layer including a first opening for exposing a part of the first electrode, the insulating layer being light transmissive;
an organic light emitting layer including a first part and a second part, the first part being provided on the part of the first electrode, the second part being provided on the insulating layer, the organic light emitting layer being light transmissive; and a second electrode provided on the organic light emitting layer, the second electrode including a conductive part and a plurality of second openings, the conductive part being disposed on at least a part of the first part, each of the second openings exposing a part of the organic light emitting layer, the second electrode being light-reflective.

2. The device according to claim 1, wherein
the first electrode having an upper face,
the insulating layer includes a plurality of the first openings, and
each of the first openings extends in a first direction parallel to the upper face and is arranged in a second direction, the second direction is parallel to the upper face and intersects with the first direction.

3. The device according to claim 2, wherein
the second electrode includes a plurality of the conductive parts, and
each of the conductive parts extends in the first direction and is arranged in the second direction, each of the conductive parts overlaps with each of the first openings when projected onto a plane parallel to the upper face.

4. The device according to claim 2, wherein
the second electrode includes a plurality of the conductive parts,
each of the conductive parts extends in the first direction and is arranged in the second direction, and
when each of the conductive parts is projected onto a plane parallel to the upper face, each of the conductive parts overlaps with one of the first openings and at least one of the first openings is disposed between each of the conductive parts.

5. The device according to claim 2, wherein
the second electrode includes a plurality of the conductive parts,
each of the conductive parts extends in the second direction and is arranged in the first direction, and
each of the conductive parts crosses each of the first openings when projected onto a plane parallel to the upper face.

6. The device according to claim 2, wherein
the second openings are arranged in the first direction and are also arranged in the second direction.

7. The device according to claim 1, wherein
the insulating layer includes a plurality of the first openings, and
each of the first openings is arranged in a first direction parallel to the upper face, and is also arranged in a second direction, the second direction is parallel to the upper face and intersects with the first direction.

8. The device according to claim 7, wherein
the second electrode includes a plurality of the conductive parts,
each of the conductive parts extends in the first direction and is arranged in the second direction, and
the conductive parts overlap with a group of the first openings arranged in the first direction among the plurality of first openings when projected onto a plane parallel to the upper face.

9. The device according to claim 1, wherein
the insulating layer includes a plurality of insulating parts, the insulating parts are arranged in a first direction parallel to the upper face and are also arranged in a second direction, the second direction is parallel to the upper face and intersects with the first direction.

10. The device according to claim 9, wherein
the organic light emitting layer includes a plurality of the second parts, each of the second parts is provided on each of the insulating parts,
the second electrode includes a plurality of the conductive parts,
each of the conductive parts extends in the first direction and is arranged in the second direction, and
the conductive parts overlap with a group of the second parts arranged in the first direction among the plurality of second parts when projected onto a plane parallel to the upper face.

11. The device according to claim 9, wherein
the organic light emitting layer includes a plurality of the second parts provided on each of the insulating parts,
the second electrode includes a plurality of the conductive parts,
each of the conductive parts extends in the first direction and is arranged in the second direction, and
the conductive parts do not overlap with a group of the second parts arranged in the first direction among the plurality of second parts when projected onto a plane parallel to the upper face.

12. The device according to claim 9, wherein
the second openings are arranged in the second direction and are also arranged in the first direction, and
the conductive part overlaps with each of the insulating parts when projected onto a plane parallel to the upper face.

13. The device according to claim 9, wherein
the second openings are arranged in the first direction and are also arranged in the second direction, and
the conductive part does not overlap with each of the insulating parts when projected onto a plane parallel to the upper face.

14. The device according to claim 1, further comprising:
a first substrate, the first substrate being light transmissive;
a second substrate, the second substrate being light transmissive; and
a seal part,
the first electrode being provided on the first substrate,
the second substrate being provided on the second electrode, and
the seal part being annularly provided along outer edges of the first substrate and the second substrate, the seal part sealing the first electrode, the second electrode, the organic light emitting layer, and the insulating layer.

15. An organic electroluminescent device, comprising:
a first electrode, the first electrode being light transmissive;
an insulating layer provided on the first electrode, the insulating layer including an opening for exposing a part of the first electrode, the insulating layer being light transmissive;
an organic light emitting layer including a first part and a second part, the first part being provided on the part of the first electrode, the second part being provided on the insulating layer, the organic light emitting layer being light transmissive;
a second electrode provided on the organic light emitting layer, the second electrode being light transmissive; and
a first wiring layer provided between the first electrode and the insulating layer, the first wiring layer including an opening for exposing a part of the first electrode, the first wiring layer being light-reflective.

16. The device according to claim 15, further comprising: a second wiring layer provided on the second electrode, the second wiring layer including an opening for exposing a part of the second electrode, the second wiring layer being light-reflective.

17. An illumination apparatus, comprising:
an organic electroluminescent device, the organic electroluminescent device including:
 a first electrode, the first electrode being light transmissive;
 an insulating layer provided on the first electrode, the insulating layer including a first opening for exposing a part of the first electrode, the insulating layer being light transmissive;
 an organic light emitting layer including a first part and a second part, the first part being provided on the part of the first electrode, the second part being provided on the insulating layer, the organic light emitting layer being light transmissive; and
 a second electrode provided on the organic light emitting layer, the second electrode including a conductive part and a plurality of second openings, the conductive part being disposed on at least a part of the first part, each of the second openings exposing a part of the organic light emitting layer, the second electrode being light-reflective; and
a power source electrically connected to the first electrode and the second electrode and supplying an electric current to the organic light emitting layer through the first electrode and the second electrode.

18. An illumination apparatus, comprising:
an organic electroluminescent device, the organic electroluminescent device including:
 a first electrode, the first electrode being light transmissive;
 an insulating layer provided on the first electrode, the insulating layer including an opening for exposing a part of the first electrode, the insulating layer being light transmissive;
 an organic light emitting layer including a first part and a second part, the first part being provided on the part of the first electrode, the second part being provided on the insulating layer, the organic light emitting layer being light transmissive;
 a second electrode provided on the organic light emitting layer, the second electrode being light transmissive; and
 a first wiring layer provided between the first electrode and the insulating layer, the first wiring layer including an opening for exposing a part of the first electrode, the first wiring layer being light-reflective; and
a power source electrically connected to the first electrode and the second electrode and supplying an electric current to the organic light emitting layer through the first electrode and the second electrode.

19. An illumination system, comprising:
a plurality of organic electroluminescent devices, each of the organic electroluminescent devices including:
 a first electrode, the first electrode being light transmissive;
 an insulating layer provided on the first electrode, the insulating layer including a first opening for exposing a part of the first electrode, the insulating layer being light transmissive;
 an organic light emitting layer including a first part and a second part, the first part being provided on the part of the first electrode, the second part being provided on the insulating layer, the organic light emitting layer being light transmissive; and
 a second electrode provided on the organic light emitting layer, the second electrode including a conductive part and a plurality of second openings, the conductive part being disposed on at least a part of the first part, each of the second openings exposing a part of the organic light emitting layer, the second electrode being light-reflective; and
a controller electrically connected to each of the organic electroluminescent devices and controlling to turn on and turn off each of the organic electroluminescent devices.

20. An illumination system, comprising:
a plurality of organic electroluminescent devices, each of the organic electroluminescent devices including:
 a first electrode, the first electrode being light transmissive;
 an insulating layer provided on the first electrode, the insulating layer including an opening for exposing a part of the first electrode, the insulating layer being light transmissive;
 an organic light emitting layer including a first part and a second part, the first part being provided on the part of the first electrode, the second part being provided on the insulating layer, the organic light emitting layer being light transmissive;
 a second electrode provided on the organic light emitting layer, the second electrode being light transmissive; and
 a first wiring layer provided between the first electrode and the insulating layer, the first wiring layer including an opening for exposing a part of the first electrode, the first wiring layer being light-reflective; and
a controller electrically connected to each of the organic electroluminescent devices and controlling to turn on and turn off each of the organic electroluminescent devices.

* * * * *